(12) United States Patent
Hansen et al.

(10) Patent No.: US 10,388,436 B1
(45) Date of Patent: Aug. 20, 2019

(54) WIRE HARNESS ASSEMBLY HOLDING DEVICE

(71) Applicant: Design Ready Controls, Inc., Brooklyn Park, MN (US)

(72) Inventors: Kaitlin Paige Hansen, Minneapolis, MN (US); Christopher Tom Mackedanz, Maple Lake, MN (US); Mario Daniel Coviello, Brooklyn Park, MN (US); Zachary Tyler Rausch, Brooklyn Park, MN (US); Troy Schmidtke, Brooklyn Park, MN (US)

(73) Assignee: Design Ready Controls, Inc., Brooklyn Park, MN (US)

( * ) Notice: Subject to any disclaimer, the term of this patent is extended or adjusted under 35 U.S.C. 154(b) by 0 days.

(21) Appl. No.: 15/670,556

(22) Filed: Aug. 7, 2017

Related U.S. Application Data

(63) Continuation-in-part of application No. 15/238,185, filed on Aug. 16, 2016, now Pat. No. 10,242,771.

(51) Int. Cl.
| | |
|---|---|
| *H02G 3/00* | (2006.01) |
| *H01B 13/012* | (2006.01) |
| *H01L 23/055* | (2006.01) |
| *H05K 3/30* | (2006.01) |
| *H02G 3/04* | (2006.01) |
| *H01L 23/049* | (2006.01) |
| *H02G 3/32* | (2006.01) |

(52) U.S. Cl.
CPC . *H01B 13/01272* (2013.01); *H01B 13/01227* (2013.01); *H01L 23/055* (2013.01); *H05K 3/301* (2013.01); *H01L 23/049* (2013.01); *H02G 3/045* (2013.01); *H02G 3/263* (2013.01); *H02G 3/32* (2013.01)

(58) Field of Classification Search
CPC ........ H01B 13/01272; H01B 13/01227; H01L 23/055; H01L 23/049; H05K 3/301; H02G 3/045; H02G 3/263; H02G 3/32
See application file for complete search history.

(56) References Cited

U.S. PATENT DOCUMENTS

| | | | | |
|---|---|---|---|---|
| 3,944,177 A | * | 3/1976 | Yoda | F16L 3/08 248/74.2 |
| 4,437,633 A | * | 3/1984 | Andre | B60R 16/0215 248/68.1 |

(Continued)

FOREIGN PATENT DOCUMENTS

| | | |
|---|---|---|
| GB | 2295497 B | 4/1998 |
| WO | 2008145081 A2 | 12/2008 |

OTHER PUBLICATIONS

Siemens, "Siemens PLM Software: Solid Edge Wire Harnessing Design—A dedicated process-driven environment for creating and routing wires and cables", available at www.siemens.com/solidedge; copyright 2014.

*Primary Examiner* — Anita M King
(74) *Attorney, Agent, or Firm* — Haugen Law Firm PLLP

(57) ABSTRACT

A peg apparatus is described that is suitable for use with an electrical wire harness peg board. The pegs are utilized on a wire harness peg board during the assembly of a wire harness, and are particularly well suited for use in an automated assembly of the electrical wire harness where a constant upward, downward or lateral tension is desired without altering the free ends of each wire of an assembled wire harness.

18 Claims, 29 Drawing Sheets

(56) References Cited

U.S. PATENT DOCUMENTS

| | | | |
|---|---|---|---|
| 4,470,179 A * | 9/1984 | Gollin | F16L 3/13 24/297 |
| 5,129,607 A * | 7/1992 | Satoh | F16L 3/13 248/73 |
| 5,168,904 A | 12/1992 | Quinkert | |
| 5,478,060 A | 12/1995 | Sugimoto et al. | |
| 5,490,664 A | 2/1996 | Justus et al. | |
| 5,535,511 A | 7/1996 | Karasik | |
| 5,535,788 A | 7/1996 | Mori et al. | |
| 5,694,678 A | 12/1997 | Karasik | |
| 6,125,532 A | 10/2000 | Takada | |
| 6,296,240 B1 | 10/2001 | Nakai et al. | |
| 6,308,944 B1 | 10/2001 | Ota et al. | |
| 6,330,746 B1 | 12/2001 | Uchiyama et al. | |
| 6,494,414 B2 * | 12/2002 | Benito-Navazo | H02G 3/0418 174/101 |
| 6,648,280 B1 * | 11/2003 | Chong | A47B 21/06 24/115 R |
| 6,709,284 B1 | 3/2004 | Avlonitis | |
| 6,865,087 B2 | 3/2005 | Jelinger | |
| 6,867,768 B2 | 3/2005 | Sakakura et al. | |
| 7,516,541 B2 | 4/2009 | Furuya et al. | |
| 7,653,987 B2 | 2/2010 | Tokuda et al. | |
| 7,674,983 B2 | 3/2010 | Nakamura | |
| 7,726,167 B2 | 6/2010 | Halford | |
| 8,356,778 B2 * | 1/2013 | Birli | F16L 3/127 248/65 |
| 8,442,664 B1 | 5/2013 | Guglielmo et al. | |
| 8,697,994 B2 | 4/2014 | Masaka | |
| 8,704,623 B2 | 4/2014 | Dumonski | |
| 8,944,111 B2 * | 2/2015 | Allendorf | F16L 3/2235 138/106 |
| 8,996,347 B2 | 3/2015 | MacLean et al. | |
| 9,054,434 B2 | 6/2015 | Kakuta et al. | |
| 9,071,042 B2 | 6/2015 | Toyama | |
| 9,306,378 B2 | 4/2016 | Murao et al. | |
| 2001/0006208 A1 * | 7/2001 | Benito-Navazo | H02G 3/0418 248/68.1 |
| 2010/0218369 A1 | 9/2010 | Selbach | |
| 2014/0111963 A1 | 4/2014 | Satake et al. | |
| 2015/0380860 A1 | 12/2015 | Moran et al. | |
| 2016/0087414 A1 | 3/2016 | Satoh | |

\* cited by examiner

WIRE HARNESS ASSEMBLY HOLDING DEVICE

CROSS-REFERENCE TO RELATED APPLICATIONS

This application claims the filing benefit and priority of U.S. Non-Provisional patent application Ser. No. 15/238,185 filed Aug. 16, 2016, the contents of which are incorporated herein by reference in its entirety.

FEDERAL SPONSORSHIP

Not Applicable

JOINT RESEARCH AGREEMENT

Not Applicable

TECHNICAL FIELD

This invention pertains generally to electrical wire harness assemblies. More particularly, the invention pertains to the pegs utilized on a wire harness peg board during the assembly of a wire harness. The pegs are particularly well suited for use in an automated assembly of the wire harness where a constant upward, downward and lateral tension is desired without altering the free ends of each wire.

BACKGROUND

Over the years, electrical wiring schematic designs have been incorporated into many tools, equipment, and machinery. Once the wiring design is established, the wires are often cut to a desired length and then bundled together to form a wire harness. The wiring designs have been improved by analyzing and creating bundles of wires having optimal routing and organization of the wires within the tool, equipment, or machine to form an ideal wire harness. It is desirable to design the wire harnesses without an excessive bundle size or bends with too small a radius. Also, the thickness, length, desired slack, and stiffness of the wires, may be taken into account when designing wire harnesses. Although designing a wire harness has been automated, it is common to use a wire harness peg board to manually assemble a wire harness. The manual assembly of the wire harness requires the placement of wires one at a time and fixing the ends of the wire so that the wires may be pulled taut as they are placed on the peg board. Fixing the ends of the wire may require an additional length of wire to allow for stripping or end finishing (for example, adding ferrules, connectors, lugs, etc.) of each wire after removal from the board.

Manual assembly of wire harnesses further increases potential for inconsistent routing of wires and inconsistent start/termination positions of each wire. The shortcomings of manual assembly may be overcome with the use of robotic aids. However, when the robot places the wires around cylindrical pegs, the wires tend to slip up and away from the pegs, thereby interfering with the robotic gripping fingers. Although clamping pegs have been improvised, the required clamping force tends to alter the insulation around the wires and even dent or otherwise damage the wires.

SUMMARY

Embodiments according to aspects of the invention allow for the automated placement of wires on a wire harness peg board without requiring manual tie offs or clamps. The wire retaining device may comprise a variety of configurations having a base and wire retaining members coupled directly or indirectly to the base. In an exemplary embodiment of the invention the wire retaining device includes a base, a main body and wire retaining members coupled to the main body. The base has a bottom portion suitable for coupling to a wire harness peg board. The main body has a channel formed into the main body or the main body is comprised of first and second opposing columns extending from a top portion of said base. The opposing columns define the wire receiving channel between the two opposing columns. The wire retaining members are joined to corresponding first and second columns and are positioned within said wire receiving channel. The wire retaining members project outward from the corresponding first and second columns of the main body at acute angles. Projecting the wire retaining members at acute angle restricts movement of a wire through the wire receiving channel in a first lateral direction and allows movement in a second lateral direction that is opposite the first lateral direction. The wire retaining members are coupled to the columns with a mating joint. A first joint portion is formed within the first and second columns and the second corresponding joint portions are formed on ends of the wire retaining members, wherein the first joint portions and second joint portions join together the columns and the wire retaining members. Those skilled in the art will appreciate that the joint portion may alternately be formed on the columns and within the wire retaining members.

The embodiment of the invention may further include wire retaining members having a triangular cross section. Also, the first joint portions and second joint portions may be of a modified tongue and groove type. Further, the wire retaining members may be constructed of a pliable material. Additionally, the first and second opposing columns may each include an outer sidewall that forms an arc extending between opposing ends of the column.

An embodiment of the wire harness wire retaining device or peg board apparatus of the present invention includes a base, a main body, a bi-directional wire receiving portion and a bi or uni-directional wire retaining portion. The base has a bottom portion suitable for coupling to a wire harness peg board. The main body extends upward from the base and includes the wire receiving portion congruent with a mid-portion of the main body. The main body also includes the wire retaining portion congruent with both the wire receiving portion and an upper portion of the main body. The wire retaining portion restricts movement of the wire in both an upward and downward direction. Similarly, the wire retaining portion may further restrict movement of the wire in a lateral, angular, tensile and compressive directions.

The embodiments of the invention may further include a wire retaining portion having a pliable portion separable from the wire retaining portion. Incorporation of the pliable portion into the wire retaining portion reduces deformation of the wires and conductors to preserve their electrical and mechanical function. Also, an alignment pin may extend from the bottom portion of the base to couple with the wire harness peg board. Alternatively, a magnet may be associated with the bottom portion of the base to couple with a wire harness peg board having magnetic properties. Further, the wire retaining portion may include pliable rubber folds that grip the wire. A thickness of at least two pliable rubber folds may have unequal thicknesses. Additionally, a wire channel diverter may be coupled to the main body of the peg to further guide the wire in a desired direction. In an embodiment of the invention the peg may have a shape that resembles a mushroom or hyperboloid.

Another embodiment of the invention includes a peg having a base, a main body extending from the base, a bi-directional wire receiving portion and bi-directional wire retaining portion associated or congruent with the main body of the base, a pliable portion of the wire retaining portion, and a wire channel diverter coupled to the main body of the base. The base has a bottom portion suitable for coupling to a wire harness peg board. The pliable portion of the wire retaining portion restricts movement of the wire in a lateral direction and the bi-directional wire retaining portion restricts movement of the wire in an upward and downward direction. An alignment pin may extend from the bottom portion of the base to inhibit tipping and axial rotation of the pegs. Alternatively or in combination with the alignment pin, a magnet may be associated with the bottom portion of the base. The pin and or magnet couple the peg to the wire harness peg board. The pliable portion may include a plurality of pliable rubber folds that grip the wire. The thickness of these folds may be congruent or the thicknesses may be unequal. Further, the number of folds may vary depending upon the amount of desired or required gripping or reduced movement (angular, tensile, and compressive) of the wire in the lateral or upward and downward directions.

The accompanying drawings, which are incorporated in and constitute a portion of this specification, illustrate embodiments of the invention and, together with the detailed description, serve to further explain the invention. The embodiments illustrated herein are presently preferred; however, it should be understood, that the invention is not limited to the precise arrangements and instrumentalities shown. For a fuller understanding of the nature and advantages of the invention, reference should be made to the detailed description in conjunction with the accompanying drawings.

DESCRIPTION OF THE DRAWINGS

In the various figures, which are not necessarily drawn to scale, like numerals throughout the figures identify substantially similar components.

DETAILED DESCRIPTION

Figure 1:
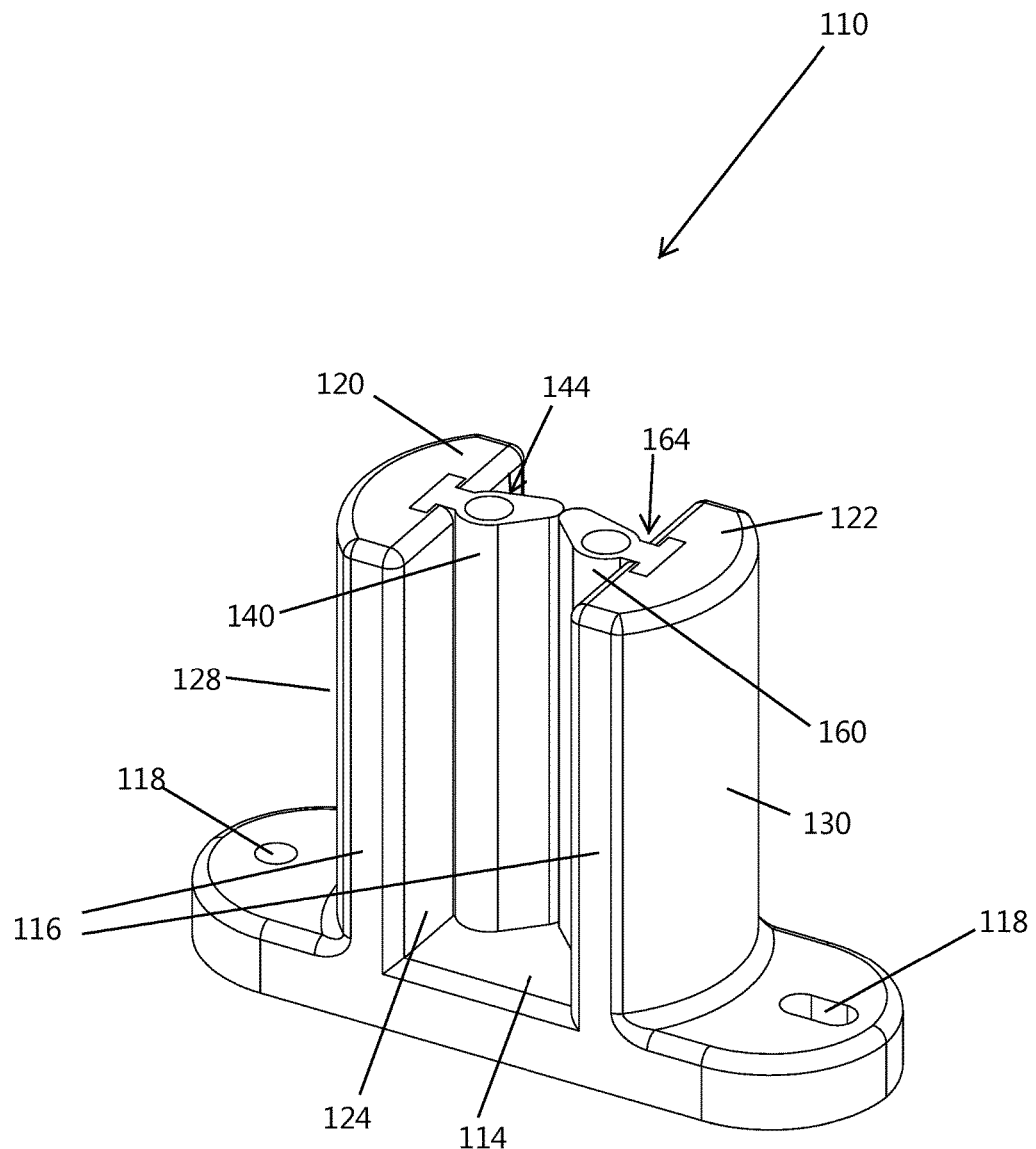
FIG. 1 is a top front right perspective view of an embodiment of the a wire retaining device of the present invention.
Figure 2:
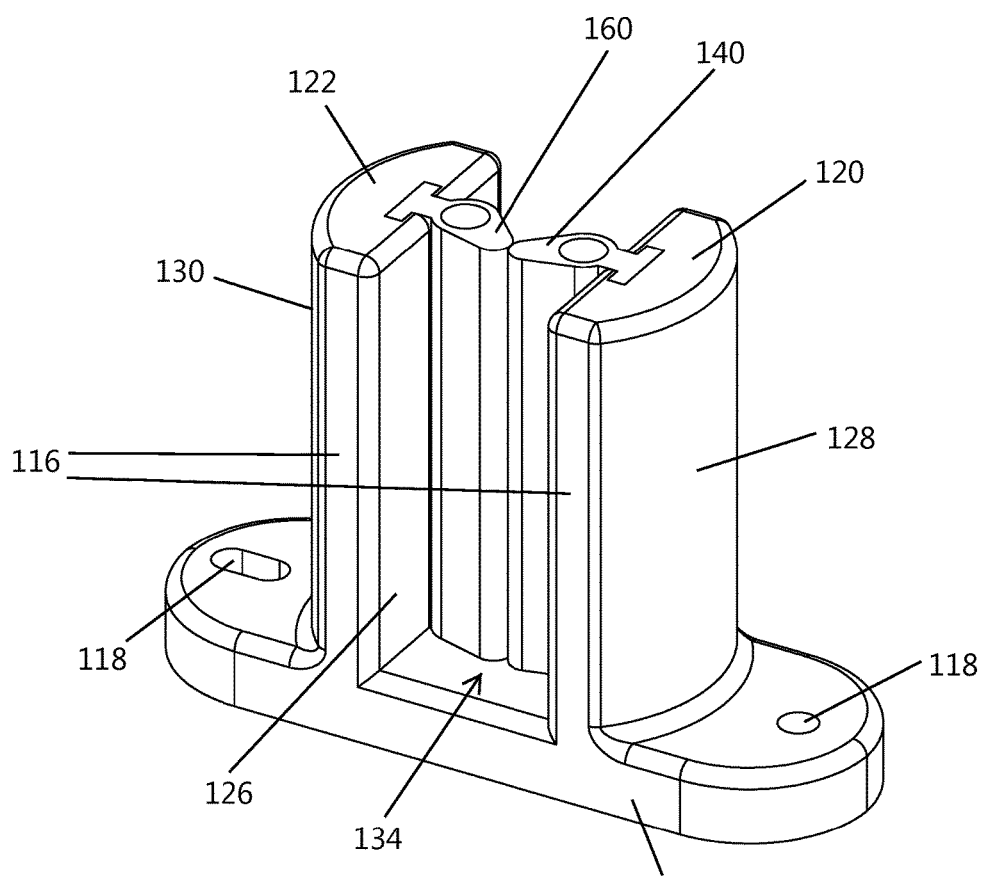
FIG. 2 is a top back left perspective view of the wire retaining device of the type shown in FIG. 1.
Figure 3:
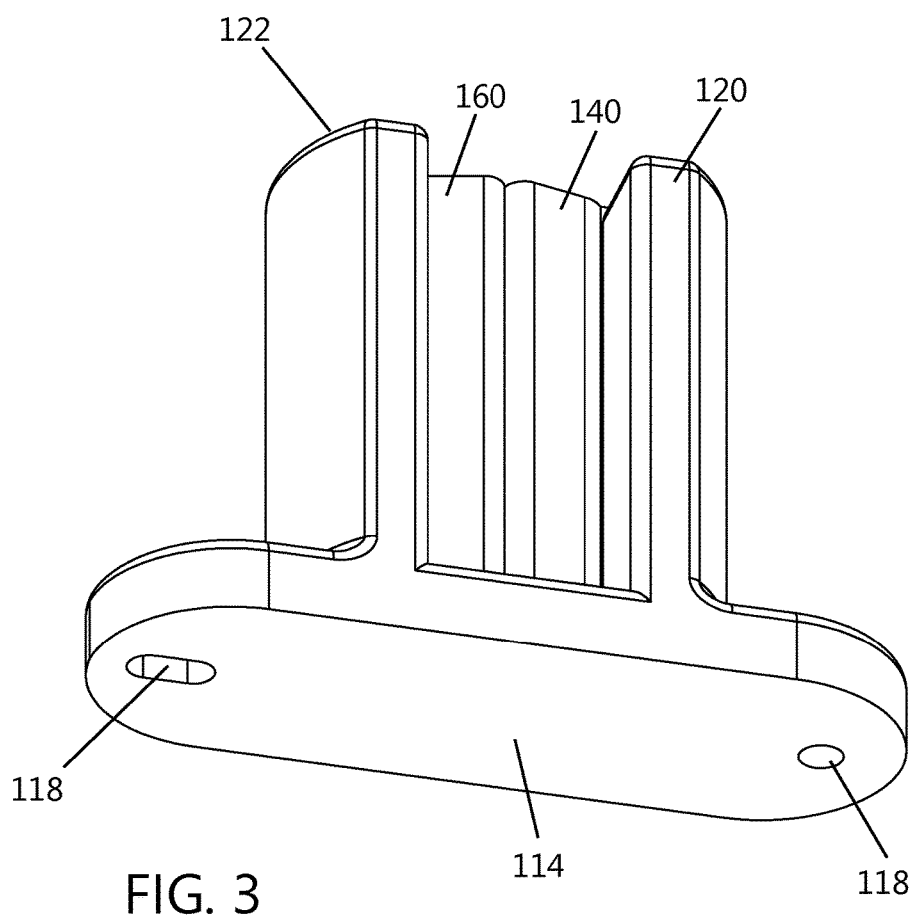
FIG. 3 is a bottom back right perspective view of the wire retaining device of the type shown in FIG. 1.
Figure 4:
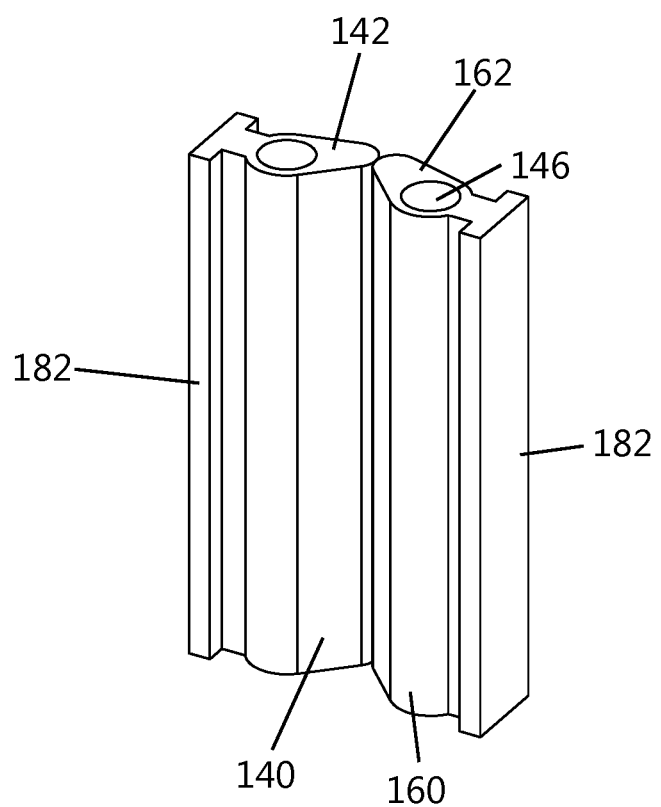
FIG. 4 is a top front right perspective view of opposing wire retaining members of the present invention.
Figure 5:
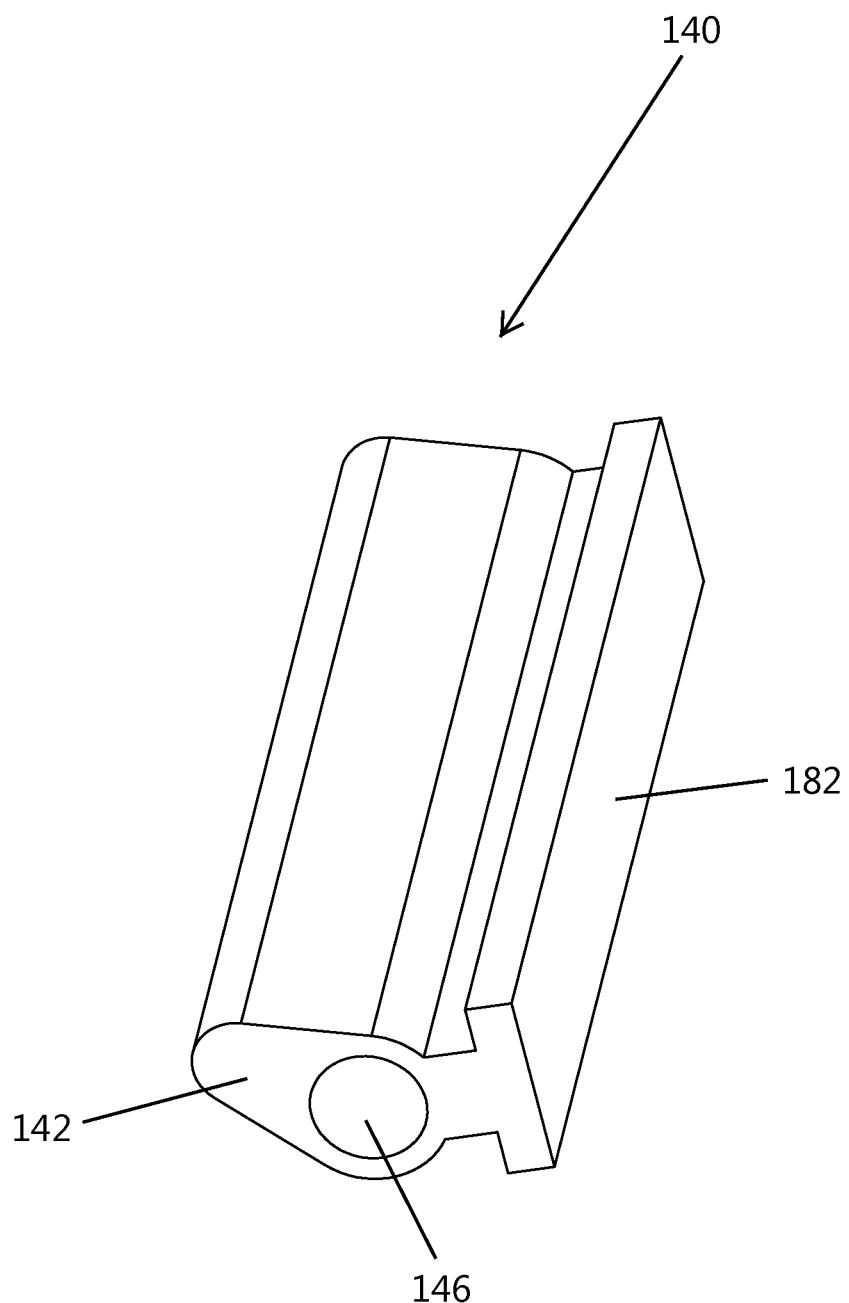
FIG. 5 is a bottom back left perspective view of a wire retaining member of the present invention.
Figure 6:
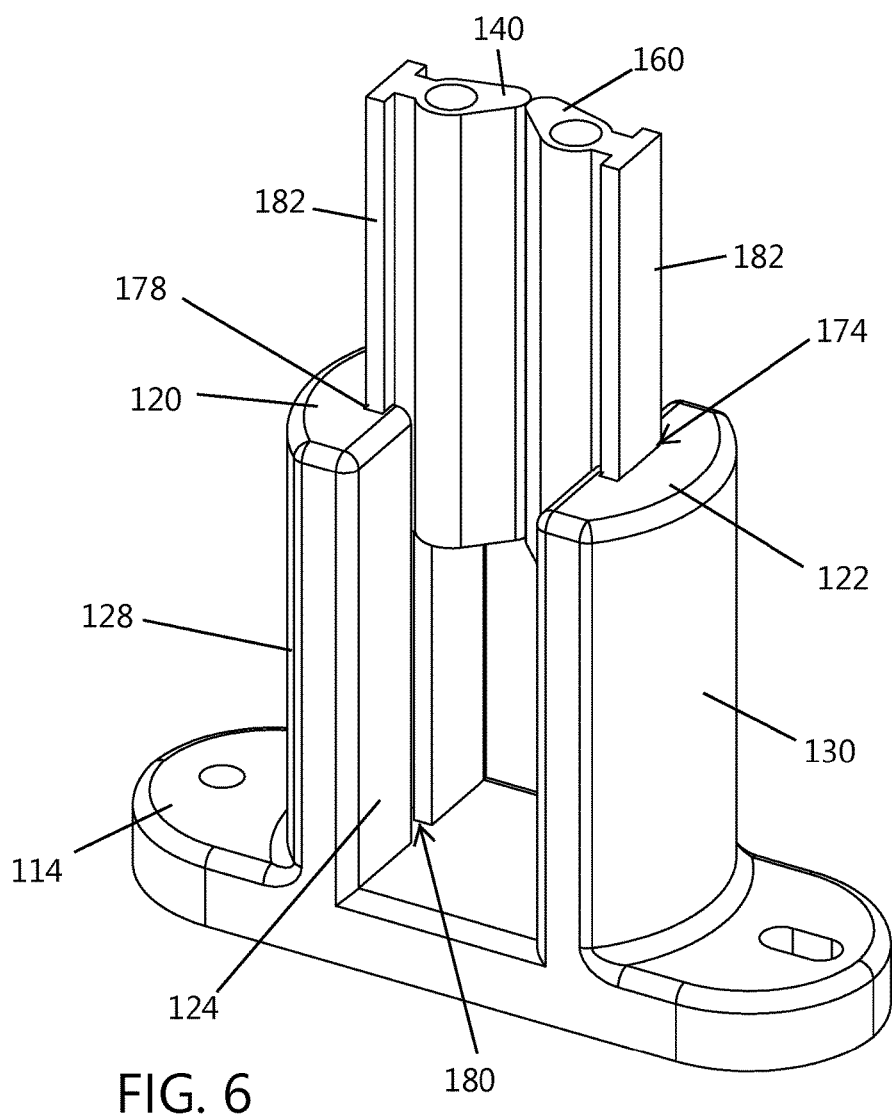
FIG. 6 is a top front right perspective view of the wire retaining device of the present invention showing opposing wire retaining members partially inserted into the main body of the wire retaining device.
Figure 7:
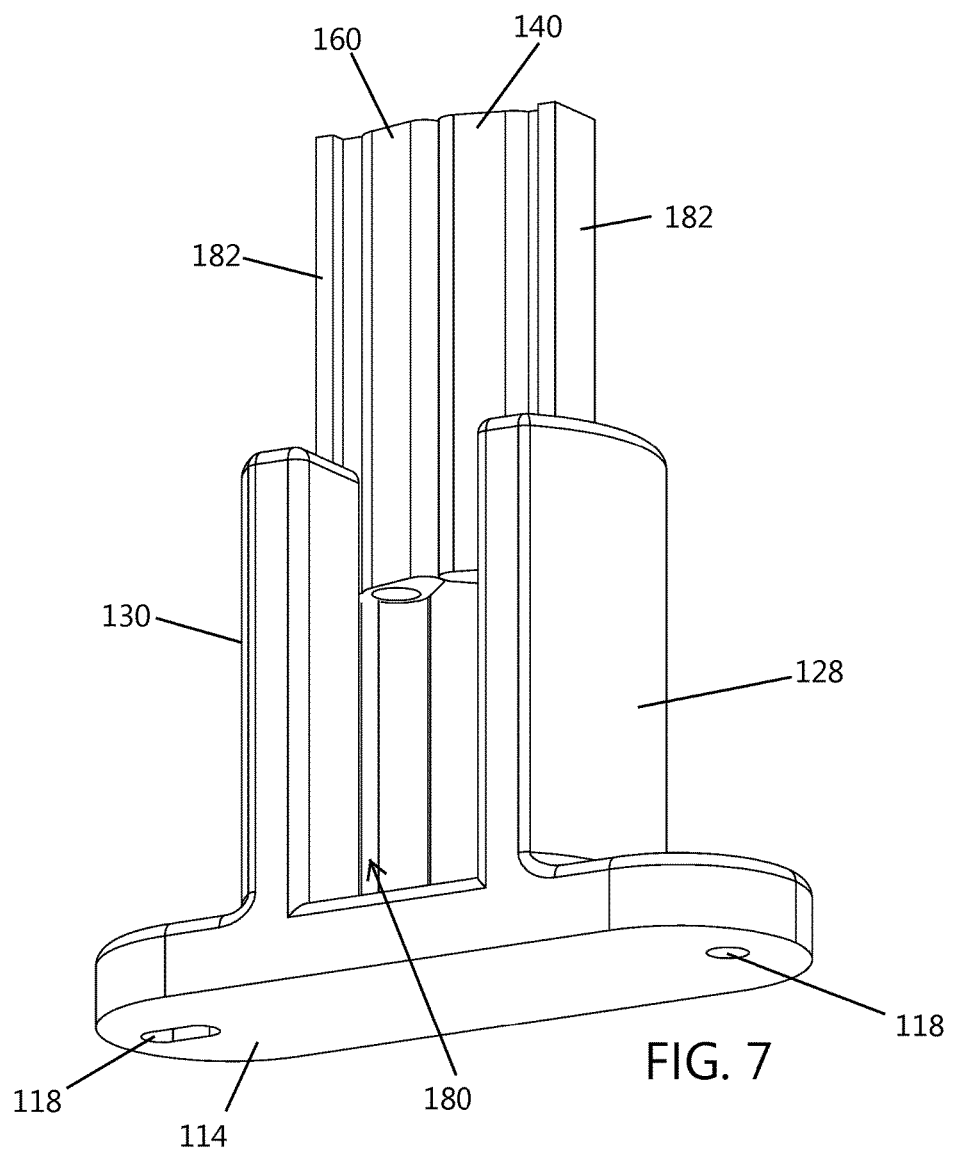
FIG. 7 is a bottom back left perspective view of the wire retaining device of the present invention showing opposing wire retaining members partially inserted into the main body of the wire retaining device.

The following description provides detail of various embodiments of the invention, one or more examples of which are set forth below. Each of these embodiments are provided by way of explanation of the invention, and are not intended to be a limitation of the invention. Further, those skilled in the art will appreciate that various modifications and variations may be made in the present invention without departing from the scope or spirit of the invention. By way of example, those skilled in the art will recognize that features illustrated or described as part of one embodiment, may be used in another embodiment to yield a still further embodiment. Thus, it is intended that the present invention also cover such modifications and variations that come within the scope of the appended claims and their equivalents.

Embodiments of the wire holding device of the present invention are particularly well suited to use when assembling wire harnesses, with or without robotic assistance. The wire holding device is capable of holding many wires at once during an automated or manual assembly of wire harnesses. The wires of the wire harness that are held within the holding device may have different wire gauges. In addition, the wire holding devices may be repositioned on a wire harness peg board as desired, which allows for quick adjustable setups, rather than permanent or semi-permanent setups. The ease of repositioning the holding devices minimizes setup and takedown time when different wire harness configurations are desired. The ease of repositioning also allows utilization of a single wire harness pegboard rather than requiring multiple permanent and static boards. The versatility of the wire harness pegboards also has the potential to minimize wasted space.

The apparatus of the present invention is particularly well suited for use in an automated assembly of electrical wire harnesses. Various embodiments of the wire holding device or peg apparatus of the present invention includes a base, a main body, a wire receiving portion and a wire retaining portion. The base has a bottom suitable for coupling to a wire harness peg board. The main body extends upward from the base and comprises a wire receiving portion congruent with the main body. The main body also includes wire retaining portions that are coupled to the main body and at least congruent with both the wire receiving portion and an upper portion of the main body. The wire receiving portion restricts movement of the wire in both an upward and downward direction. Similarly, the wire retaining portion further restricts movement of the wire in a lateral direction. The wire receiving portion and wire retaining portion firmly restricts both lateral movement and vertical movement of the wire without requiring a force that alters the wire, wire casing, or wire ends. Those skilled in the art will appreciate that the wire holding device or peg apparatus may be constructed in various shapes and configurations while still incorporating the wire receiving portion and wire retaining portion.

With reference to FIGS. 1-7, embodiments according to aspects of the invention will be described in conjunction with the wire harness device 110 shown in these figures. The wire harness device 110 includes a base 114, main body 116, channel or wire receiving portion 134 defined by the main body, and wire retaining members 140 and 160. The base 114 is preferably wider than the main body 116, with rounded edges to decrease stresses. The base 114 has one or more attachment points 118 to attach the wire holding device 110 to a work surface or wire harness peg board. The base attachment points may include apertures and slots into which a bolt or pin may be inserted to attach the wire holding device 110 to the work surface. Alternatively, without limitation, other attachment methods such as magnets or pegs may be utilized to couple the wire harness device to the work surface. The bottom surface of the base is suitably shaped to interface with the work surface. Although a flat surface is illustrated, those skilled in the art will appreciate that other configurations are possible without departing from the scope of the invention.

The main body 116 includes wire receiving channel 134 formed in the main body or defined by two opposing columns 120 and 122 extending upward from the base 114. Columns 120 and 122 may be rounded at the edges to reduce sharp corners and to decrease stresses and fabrication time when using additive manufacturing. Columns 120 and 122 include corresponding inner sidewalls 124 and 126 and outer sidewalls 128 and 130. The outer sidewalls 128 and 130 are preferably rounded to allow routing of wires around the surface without potentially kinking a wire on the outer surface. Those skilled in the art will appreciate that other shapes are possible.

The main body 116 or columns 120 and 122 include corresponding wire retaining members 140 and 160. The wire retaining members each have a corresponding triangular cross section 142 and 162 extending from the corresponding inner sidewalls 124 and 126. The portions of the wire retaining members 140 and 160 extending from the sidewalls are known as gates. The gates are made to grip wire or other workpieces, and are preferably made of a flexible material. An exemplary material is TPU 95A 3D printer filament, although those skilled in the art will appreciate that other materials are possible, such as rubber or foam. The gate portions of the wire retaining members 140 and 160 may include apertures 146 extending lengthwise through the gates. The size of the aperture may be enlarged or reduced to increase or decrease the flexibility of the gates. When the gates are composed of 3D printable material, the infill percentage may also be increased or decreased in order to increase or decrease the gate flexibility. The gate portion of the first and second wire retaining members 140 and 160 extend from the inner sidewalls 124 and 126 at acute angles 144 and 164 to form uni-directional gates. The uni-directional gates allow a wire or other work piece to extend laterally through the channel 134 or pull laterally through the channel 134 in a single lateral direction. Those skilled in the art will appreciate that it is possible to modify the shape of the gates to extend from the sidewalls orthogonal to the sidewalls 124 and 126. In this manner the gates may allow bi-directional lateral movement of the wires through the wire retaining device. Further, the spacing between opposing wire retaining members 140 and 160 gates may be increased or decreased to allow for the holding of work pieces of varying sizes. Those skilled in the art will appreciate that other various shapes and orientations of the wire retaining members 140 and 160 are possible, without departing from the intent of the invention.

The wire retaining members 140 and 160 further include an interlock 174 that couples the members 140 and 160 to the main body 116. The interlock may be formed from a variety of different joints to fix the position of the members 140 and 160 relative to the main body 116. A modified mortise and tenon or modified tongue and groove or t-slot joint 178 is shown for illustrative purposes without limitation intended. The interlock includes a first joint portion 180 formed in the main body 116 or columns 120 and 122 and a mating or mirroring second joint portion 182 formed on ends of the wire retaining members 140 and 160. The connection portion or joint 182 of the wire retaining members 140 and 160 may be made of a flexible or rigid material. By way of example, and without limitation intended, the members including joint 182 may be made from a TPU 95A 3D printer material. Similarly, the base 114 and main body 116 may be made from a PLA 3D printer filament. As noted above, it is also possible to make the members 140 and 160 removable and interchangeable, for various applications.

It is preferable to construct the wire holding device 110 to be as durable as needed. That is, when using it for experimental purposes, it is beneficial to make it of a weaker material that will break, so that it sustains damage instead of damaging the work surface or robotic apparatus. However, when in a production setting, it may be desirable to manufacture the wire holding device 110 of more durable materials to withstand jarring, shock of being dropped, robotic bumps, or other similar circumstances.

With reference to FIGS. 8-14, embodiments according to aspects of the invention will be described in conjunction with the peg apparatus 10 shown in these figures. The peg 10 includes a base 14, main body 16, first pair of slots 40, top 26, and magnet receiving pocket 32. The main body includes first and second, opposed, upwardly extending sides 20 and 22 that together form a wire receiving portion or channel 60. The slots 40 formed in the opposing sides 20 and 22 are adapted for receiving bi-directional, pliable flaps 50. The opposing flaps 50 extend towards each other and may overlap or may be separated to form a slight gap between the opposing pair of flaps. A wire may be positioned down and into the wire receiving channel 60 and in contact with the pliable flaps 50. The amount of gap may be selected depending upon the type of wire being positioned in the wire receiving channel 60 and depending more generally upon the routing of the wire on the wire harness pegboard. The sides 20, 22 and flaps 50, 52 together form the wire retention portion 70. The separation distance may be defined by altering the width of the flaps to allow the wire to pass between the flaps 50 while providing flaps 50 that retain the wire in the channel and restrict vertical and lateral movement of the wire in the channel.

Figure 8:
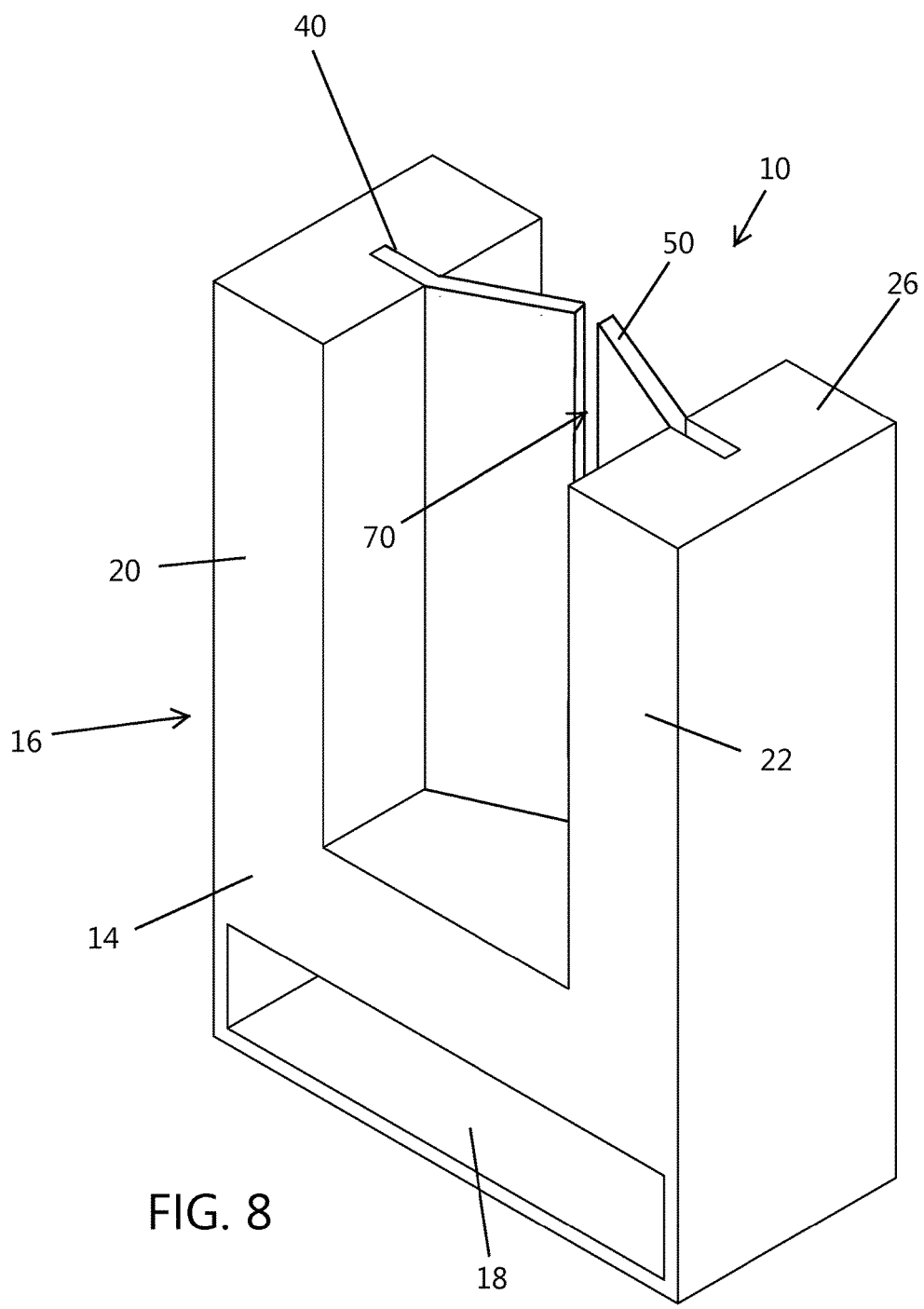
FIG. 8 is an upper, right, perspective view of an embodiment of a wire retaining peg apparatus of the present invention.
Figure 9:
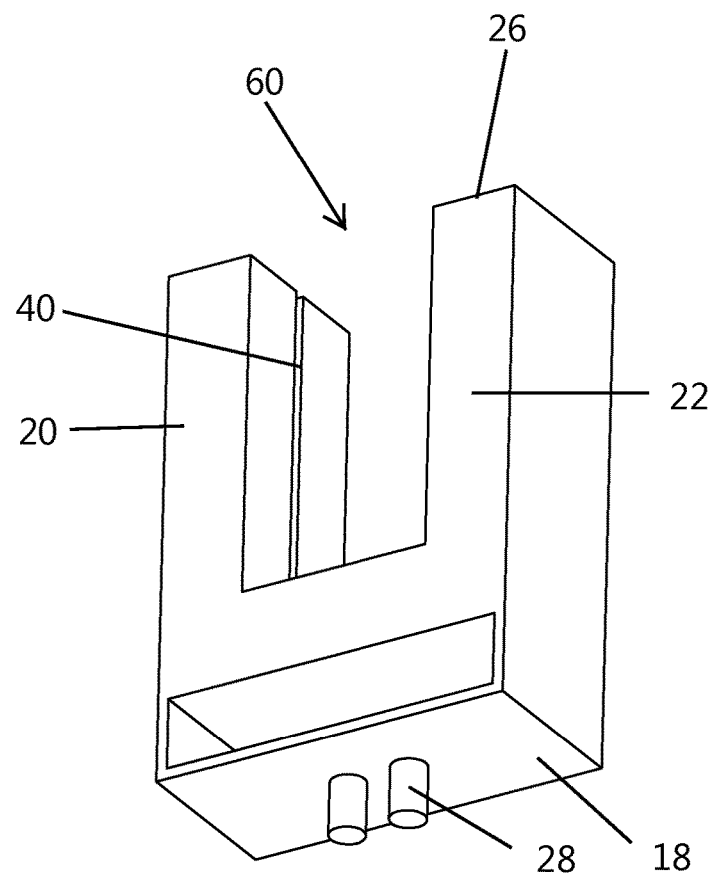
FIG. 9 is a lower, right, perspective view of an embodiment of a wire retaining peg apparatus of the present invention, showing pins extending from a base of the peg.
Figure 10:
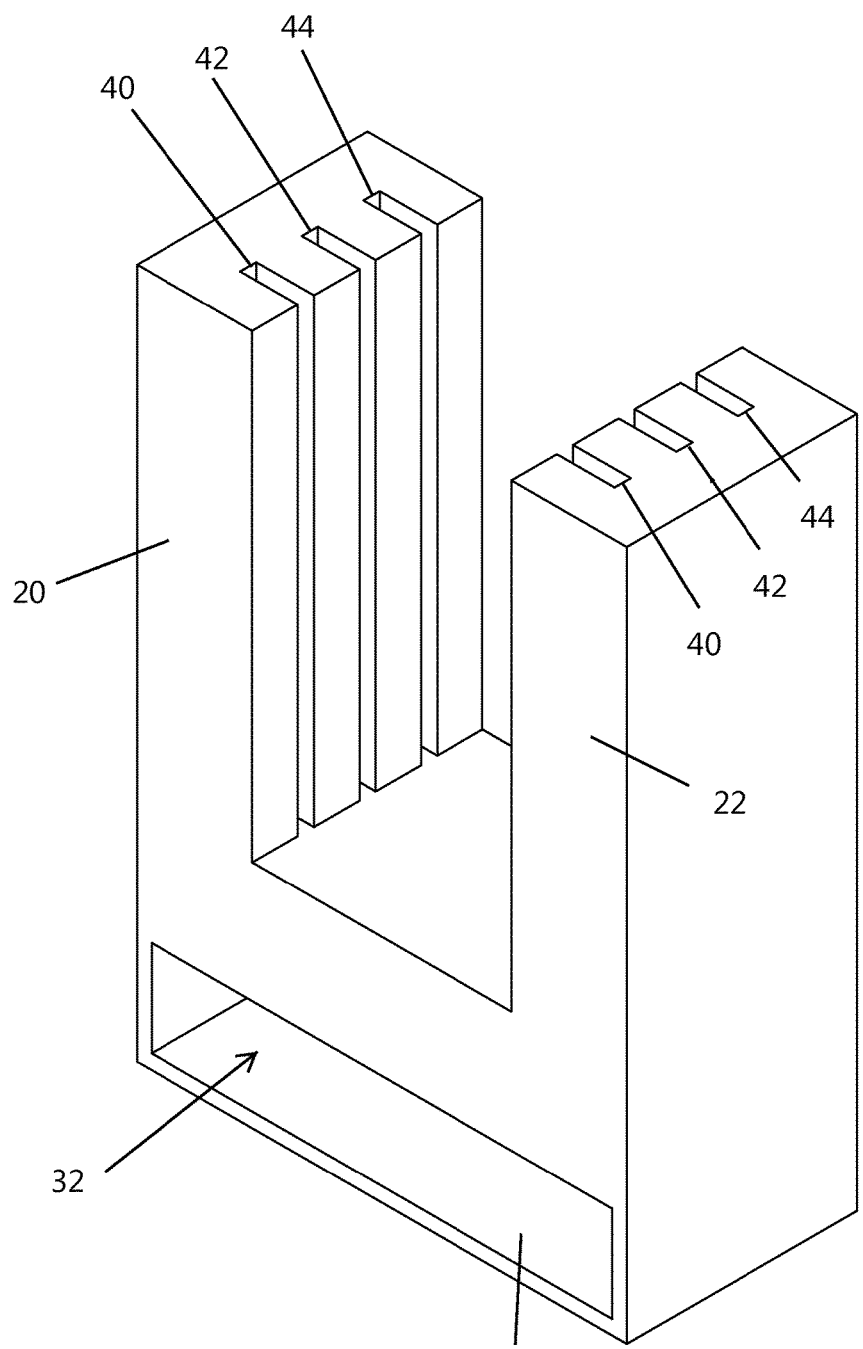
FIG. 10 is an upper, right, perspective view of an embodiment of a wire retaining peg apparatus of the present invention, showing slots suitable to receive pliable rubber flaps.
Figure 11:
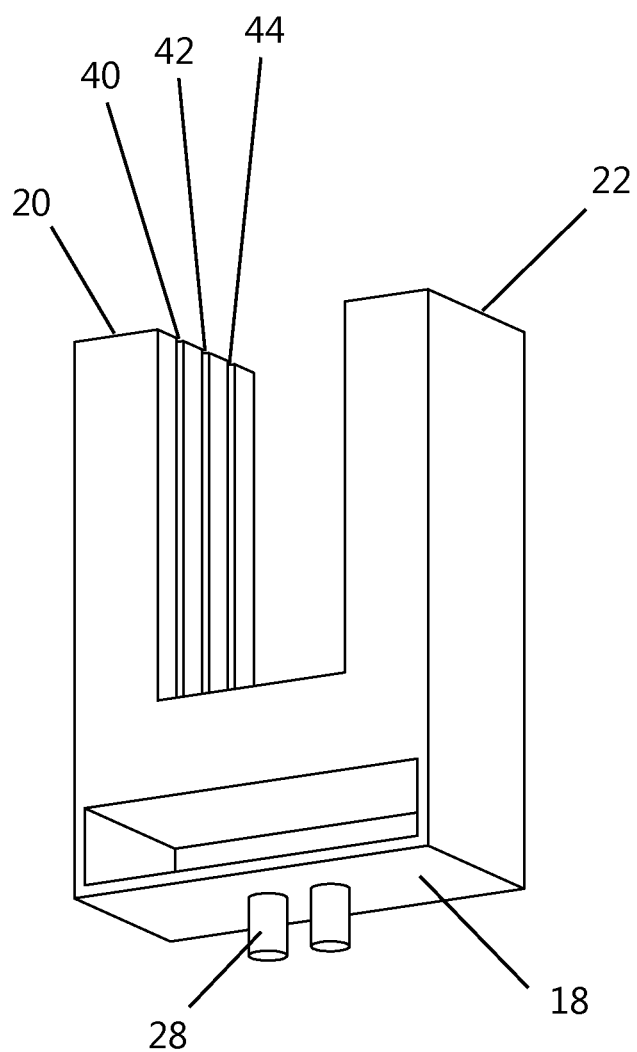
FIG. 11 is a lower, right, perspective view of an embodiment of a wire retaining peg apparatus of the present invention, showing pins extending from a base of the peg.
Figure 12:
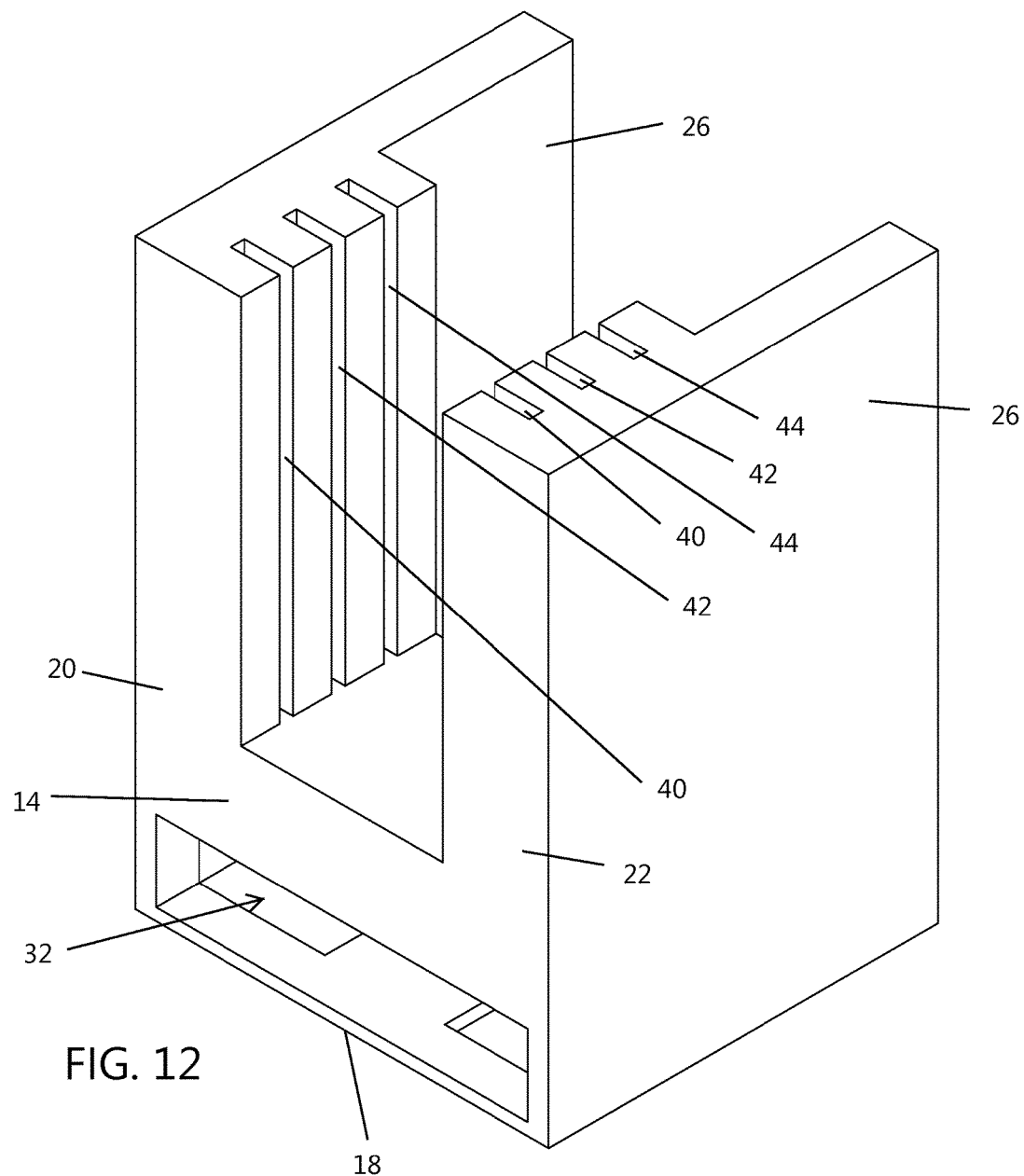
FIG. 12 is an upper, front perspective view of an embodiment of a wire retaining peg apparatus of the present invention, showing slots suitable to receive pliable rubber flaps.
Figure 13:
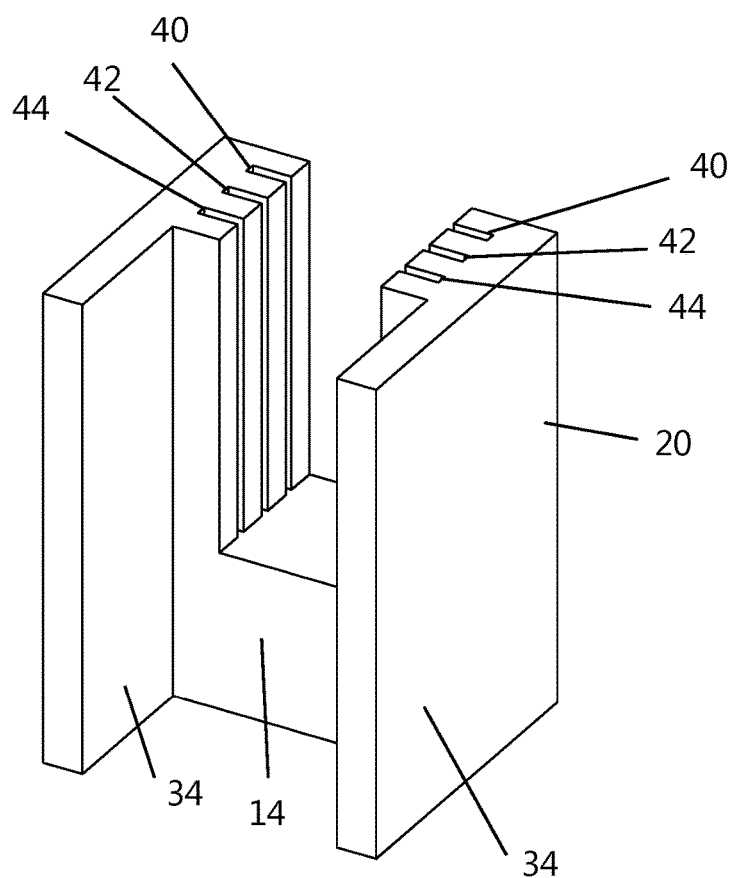
FIG. 13 is an upper back perspective view of the wire retaining peg apparatus of the type shown in FIG. 12.
Figure 14:
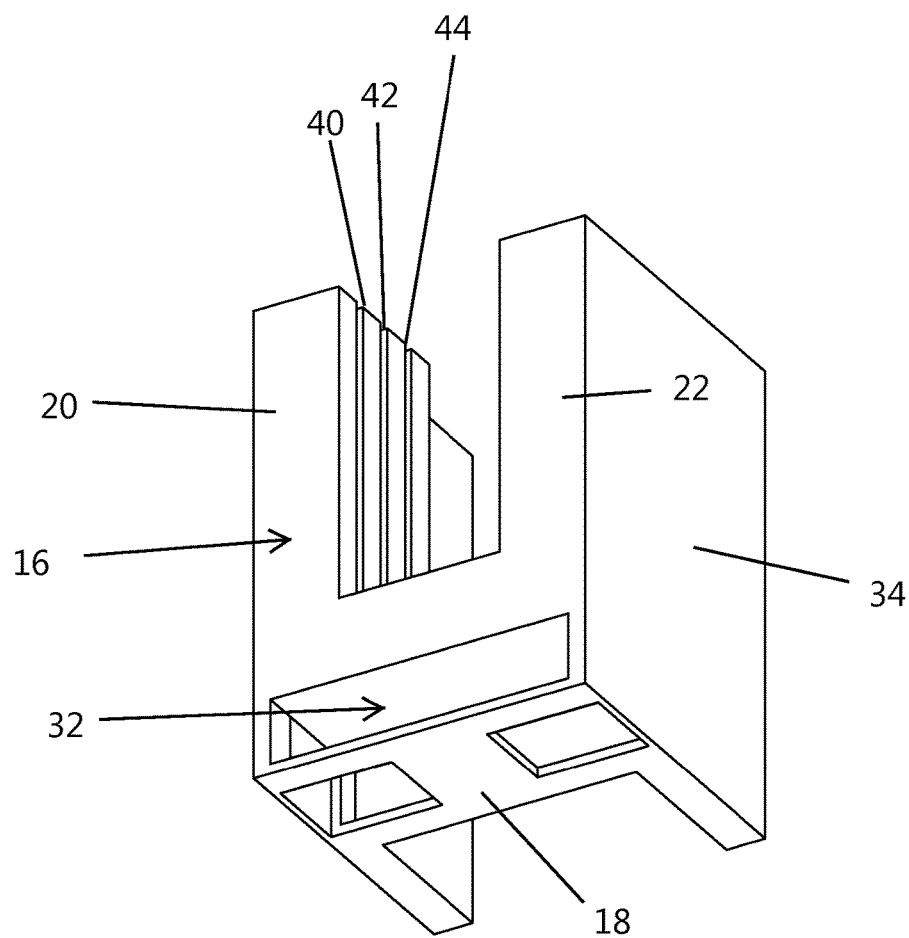
FIG. 14 is a lower front perspective view of the wire retaining peg apparatus of the type shown in FIG. 12.

FIGS. 8 and 9 illustrate a peg 10 having a single pair of pliable flaps 50 positioned in the wire receiving channel 60. Alternatively, FIGS. 10 and 11 illustrate a triple pair of flaps 50, 52, and 54 positioned in pairs of slots 40, 42 and 44. FIGS. 12-14 also illustrate triple pairs of flaps 50, 52, and 54 positioned in pairs of slots 40, 42, and 44 and further illustrates extended sides 34 of the main body. The size, stiffness, and number of flap pairs may be chosen dependent upon the particular wire harness that is assembled. Additionally, FIGS. 9 and 11 show alignment pins 28 extending from the bottom 18 of the base 14. The alignment pins 28 may be utilized to couple the pegs 10 to a wire harness peg board in a desired location on the board. Alternatively, the magnet receiving pocket 32 is adapted to receive a magnet 30 that may be utilized in conjunction with a wire harness peg board made of a ferromagnetic material couple the peg 10 to the peg board.

Figure 15:
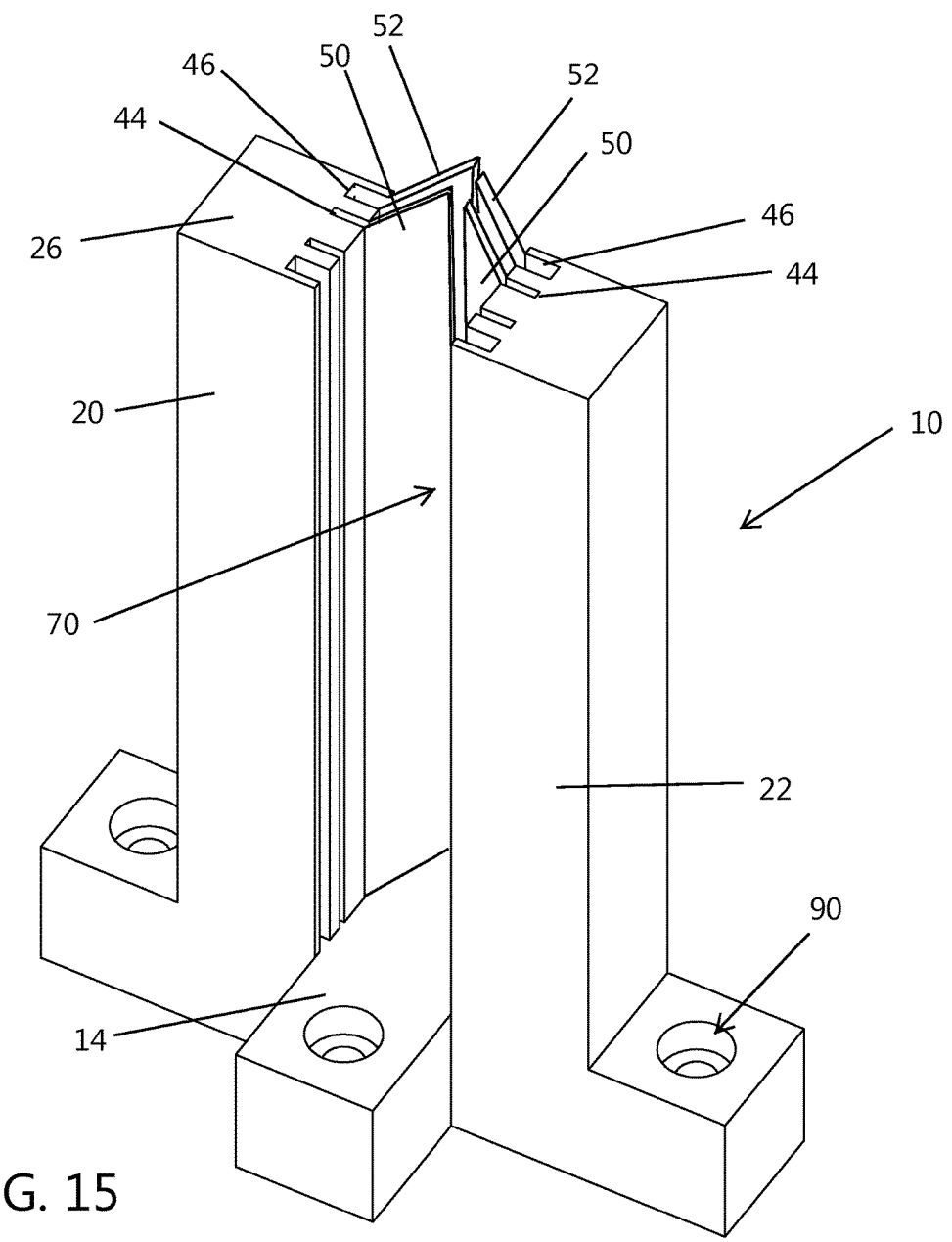
FIG. 15 is an upper, front, perspective view of an embodiment of a wire retaining peg apparatus of the present invention.
Figure 16:
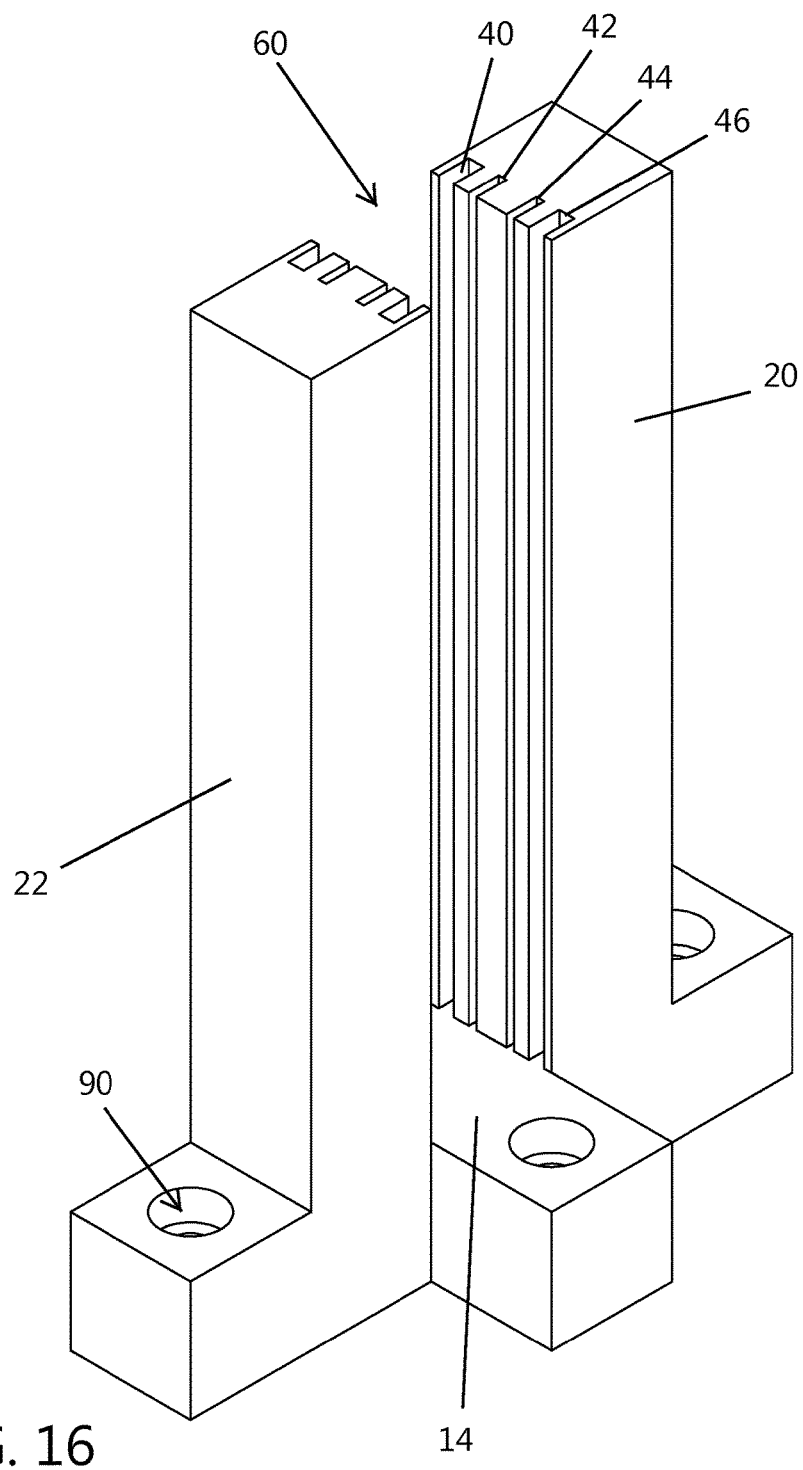
FIG. 16 is an upper back perspective view of the wire retaining peg apparatus of the type shown in FIG. 15 and showing the pliable flaps removed.

FIGS. 15 and 16 illustrate a peg 10 embodiment according to aspects of the invention having four pairs of slots 40, 42, 44, and 46 that are adapted to receive corresponding pairs of flaps. Those skilled in the art will appreciate that numerous configurations may be created by adding or removing flap pairs to one or more of the slot pairs. The number of flap pairs and spacing between the flap pairs may be chosen to increase or decrease the amount of resistance provided against a wire held in place between the flap pairs. The peg 10 includes a base 14, main body 16, slot pairs 40, 42, 44, and 46, and top 26. The main body includes first and second, opposed, upwardly extending sides 20 and 22 that together form a wire receiving portion or channel 60. The slot pairs 40, 42, 44, and 46 formed in the opposing sides 20 and 22 are adapted for receiving bi-directional, pliable flaps 50 and 52. The opposing flaps may be positioned in opposing slot pairs or in other slot arrangements. The flap pairs extend toward each other and may overlap or may be separated to form a slight gap between the opposing pair of flaps. A wire may be positioned down and into the wire receiving channel 60 and in contact with the pliable flaps. The amount of gap, spacing between flap pairs, number of flap pairs, and orientation of flap pairs may be selected depending upon the type of wire being positioned in the wire receiving channel 60 and depending more generally upon the routing of the wire on the wire harness pegboard. The sides and flaps together form the wire retention portion 70 that retains the wire in the channel and restricts vertical and lateral movement of the wire in the channel. The base 14 includes apertures 90 extending through the base. The apertures 90 are adaptable for receiving pins that extend through the apertures and engage the peg 10 to the wire harness peg board.

Figure 17:
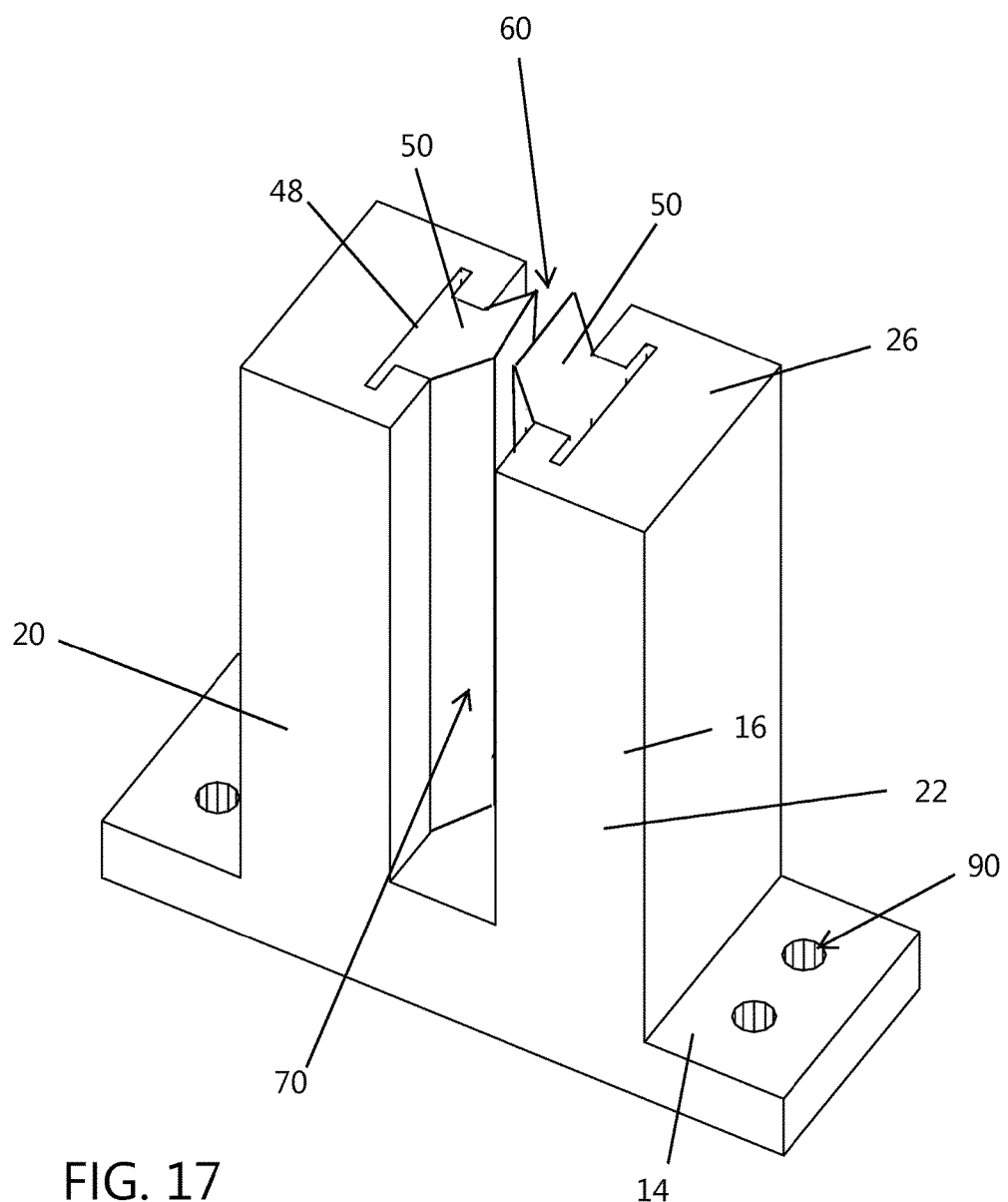
FIG. 17 is an upper, front perspective view of an embodiment of a wire retaining peg apparatus of the present invention, showing a thick pliable flap inserted in a slot of the main body.

FIG. 17 illustrates a peg 10 embodiment according to aspects of the invention having a single pair of slots 40 that includes an interlocking feature 48 to interlock flap 50 within the slot. Those skilled in the art will appreciate that the pliable, flexible, flap 50 is thicker than the thickness dimension of other shown and described embodiments. The thickness of flap 50 may be chosen to increase or decrease the amount of resistance provided against a wire held in place between the flap pair. The peg 10 includes a base 14, main body 16, slot pair 40, and top 26. The main body includes first and second, opposed, upwardly extending sides 20 and 22 that together form a wire receiving portion or channel 60. The slot pair formed in the opposing sides 20 and 22 are is adapted for receiving the bi-directional, pliable, interlocking flap 50. The sides and flaps together form the wire retention portion 70 that retains the wire in the channel and restricts vertical and lateral movement of the wire in the channel. The base 14 includes apertures 90 extending through the base. The apertures 90 are adaptable for receiving pins that extend through the apertures and engage the peg 10 to the wire harness peg board.

Figure 18:
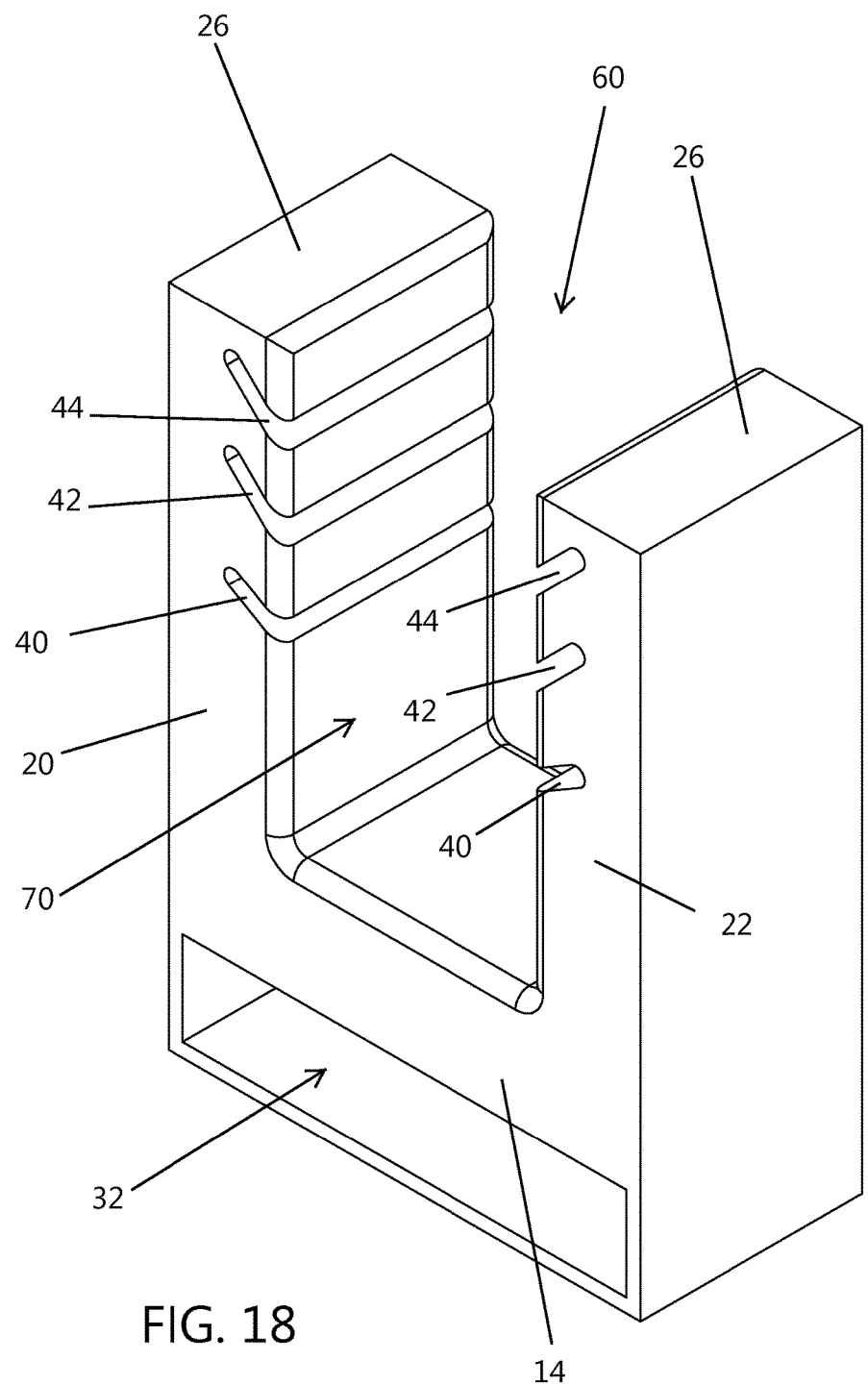
FIG. 18 is an upper front perspective view of an embodiment of a wire retaining peg apparatus of the present invention, showing slots suitable to receive pliable rubber flaps.
Figure 26:
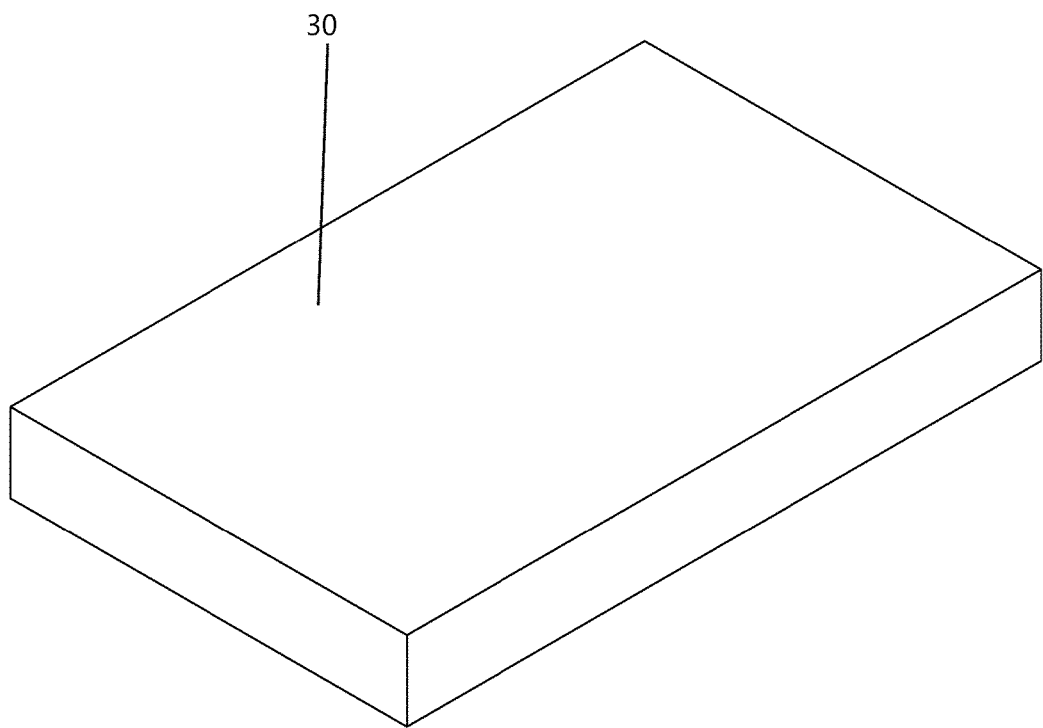
FIG. 26 is a perspective view of a magnet of the present invention suitable for association or coupling with a base of the type shown in FIG. 25.

FIG. 18 illustrates another peg 10 embodiment according to aspects of the invention having laterally oriented pairs of slots 40, 42, and 44 extending into sides 20 and 22. The peg 10 includes a base 14, main body, slot pairs 40, 42, and 44, magnet receiving pocket 32, and top 26. The main body includes first and second, opposed, upwardly extending sides 20 and 22 that together form a wire receiving portion or channel. The slot pairs 40, 42, and 44 formed in the opposing sides 20 and 22 are adapted for receiving bi-directional, pliable flaps. The opposing flaps may be positioned in opposing slot pairs or in other slot arrangements. The flap pairs extend toward each other and may overlap or may be separated to form a slight gap between the opposing pair of flaps. A wire may be positioned down and into the wire receiving channel 60 and in contact with the pliable flaps. The amount of gap, spacing between flap pairs, number of flap pairs, and orientation of flap pairs may be selected depending upon the type of wire being positioned in the wire receiving channel 60 and depending more generally upon the routing of the wire on the wire harness pegboard. Further the orientation of the flaps is particularly well suited for retaining larger diameter wires in the channel while also restricting vertical and lateral movement of the wire in the channel. The base 14 includes magnet receiving pocket 32 formed through the base. The pocket 32 is adaptable for receiving magnet 30 (illustrated in FIG. 26) to magnetically couple the peg 10 to the wire harness peg board.

Figure 19:
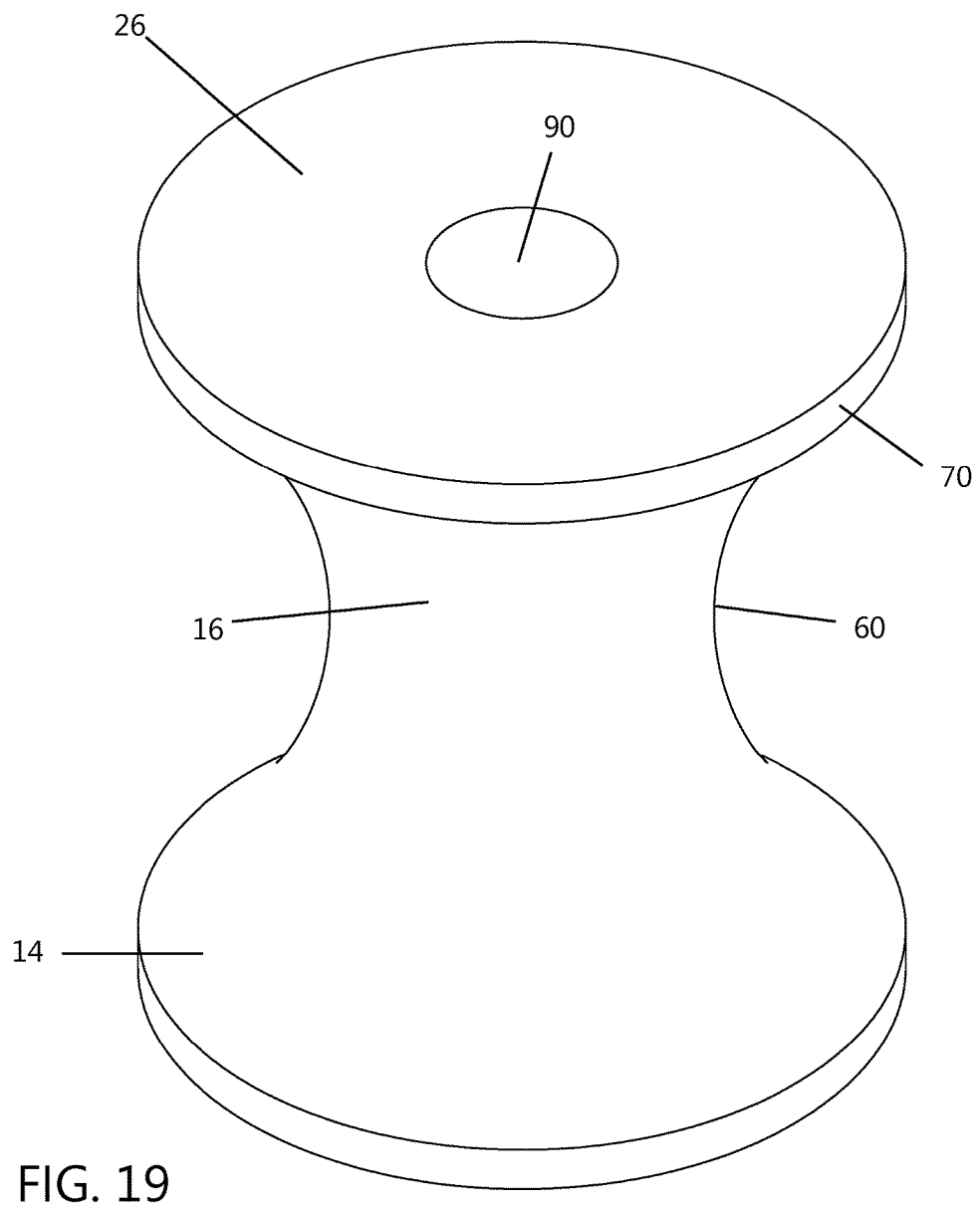
FIG. 19 is an upper, front perspective view of an embodiment of a wire retaining peg apparatus of the present invention, having a substantial mushroom shape.
Figure 20:
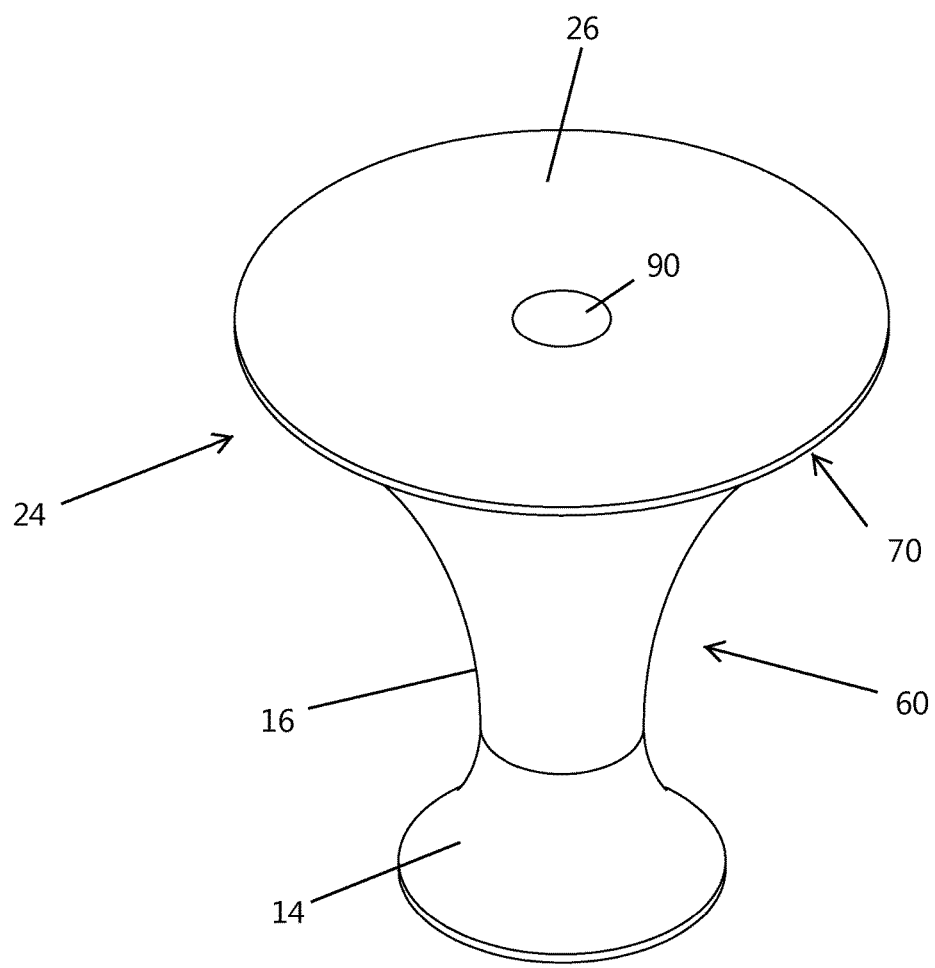
FIG. 20 is an upper, front perspective view of an embodiment of a wire retaining peg apparatus of the present invention, having a substantial mushroom shape.
Figure 21:
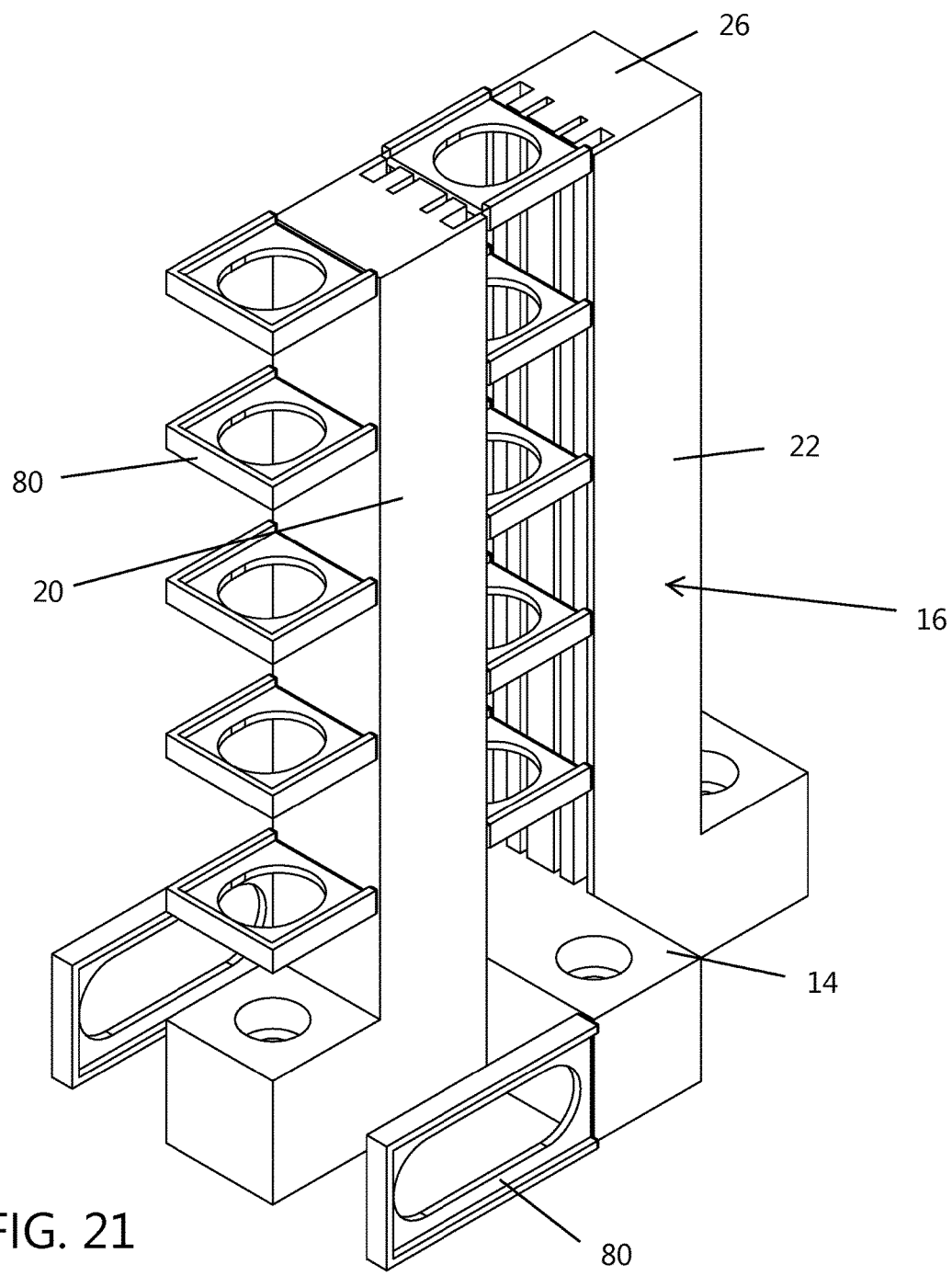
FIG. 21 is an upper perspective view of an embodiment of a wire retaining peg apparatus of the present invention, showing a channel diverter coupled to a main body of the peg apparatus.
Figure 22:
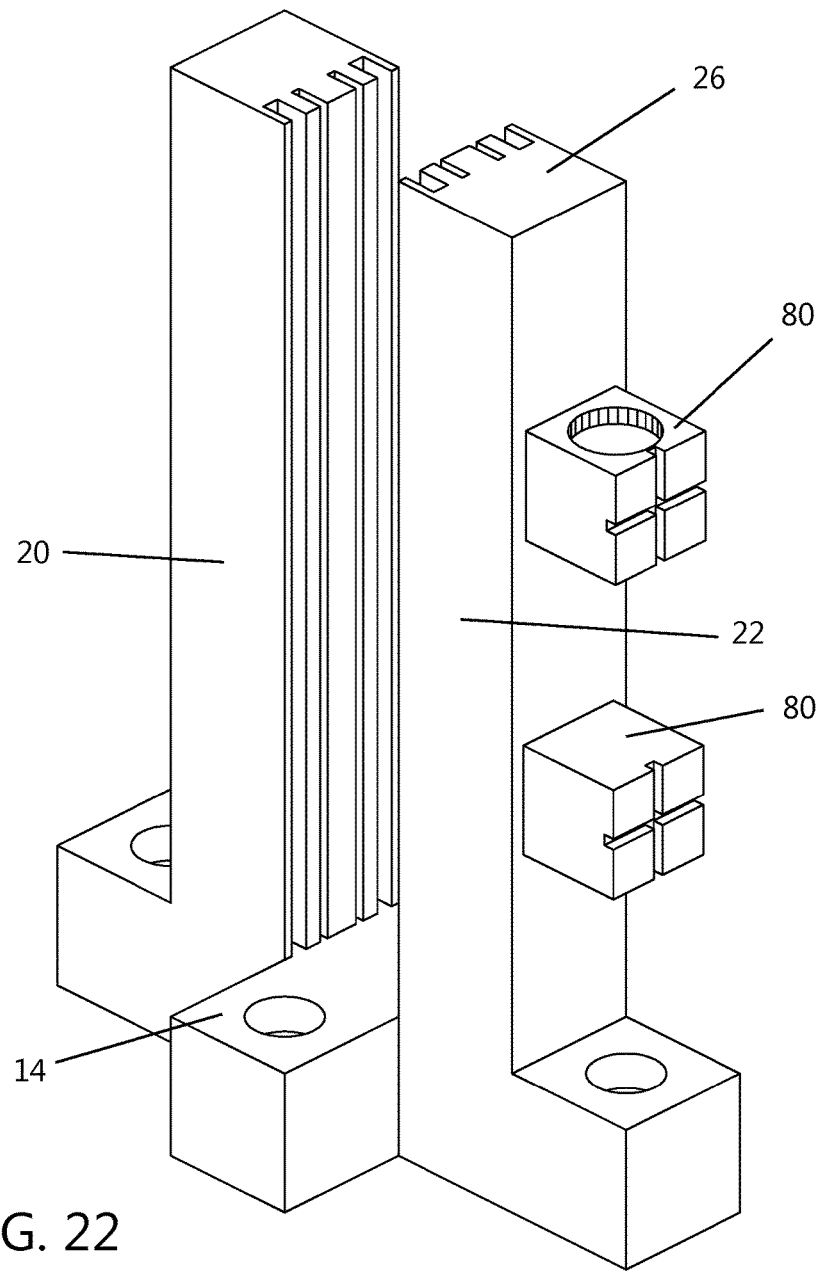
FIG. 22 is an upper perspective view of an embodiment of a wire retaining peg apparatus of the present invention, showing a channel diverter coupled to a main body of the peg apparatus.

With reference to FIGS. 19 and 20 mushroom shape 24 pegs 10 according to aspects of the invention are illustrated.

Figure 25:
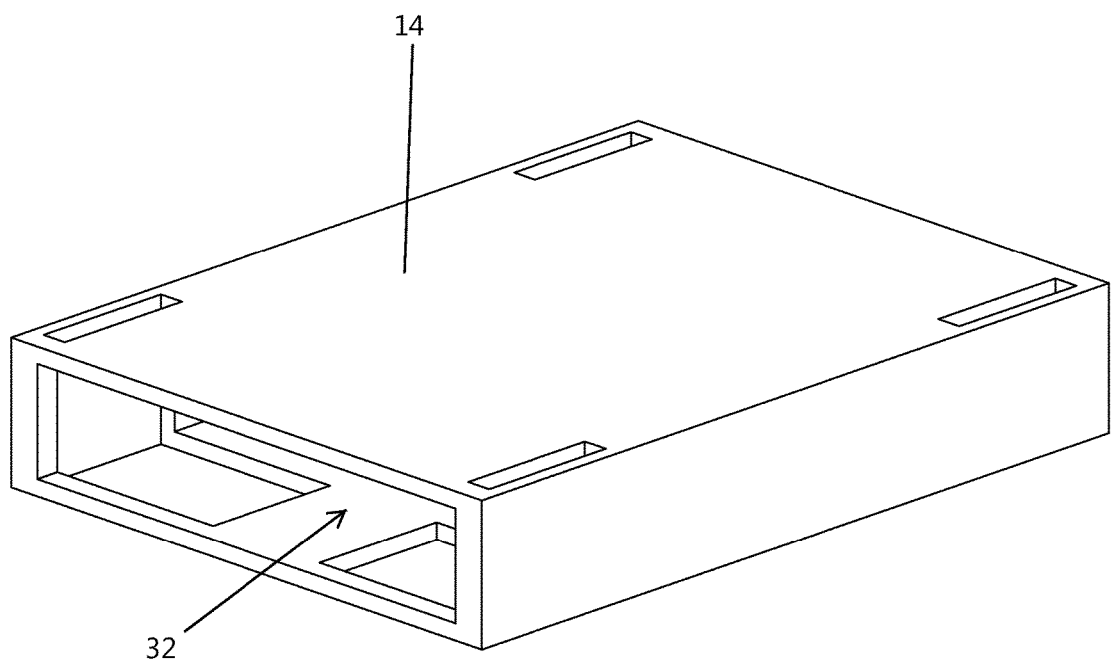
FIG. 25 is a perspective view of an embodiment of a wire retaining peg base of the present invention.
Figure 27:
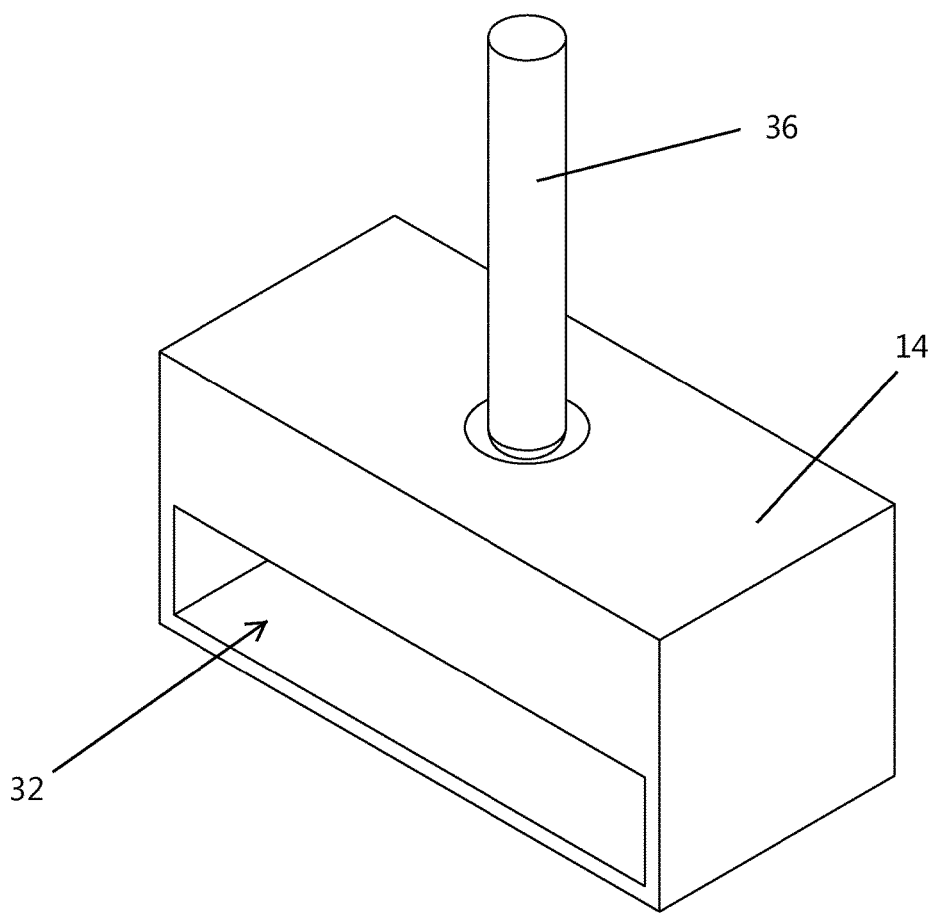
FIG. 27 is a perspective view of an embodiment of a wire retaining peg base or peg assembly of the present invention.
Figure 28:
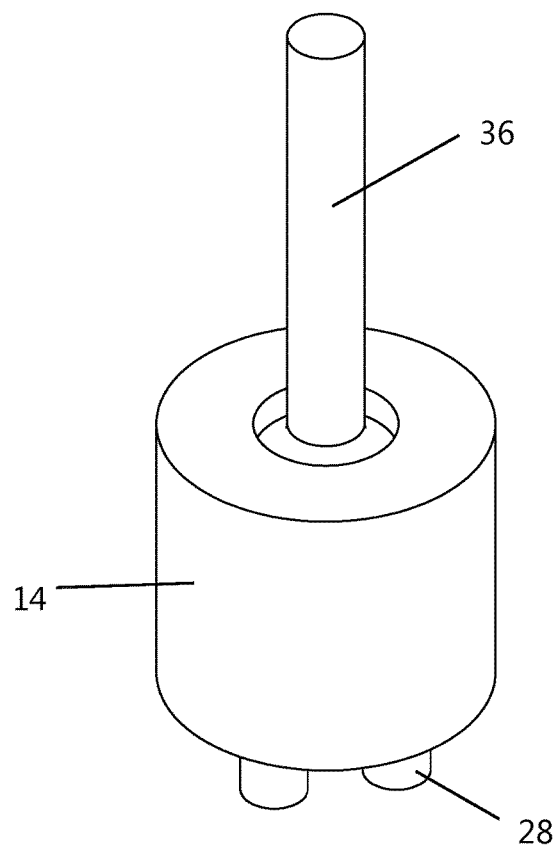
FIG. 28 is a perspective view of an embodiment of a wire retaining peg base of the present invention.

The peg 10 includes a base 14, main body 16, and top 26. The main body 16 at least partially resembles a spool or cylinder but is modified so that the diameter of the top 26 is larger than a diameter of a mid-portion of the main body 16 and/or the base 14. In this manner, an upper portion of the peg forms the wire retention portion 70 and the mid portion of the main body forms the wire receiving portion 60. Aperture 90 extends through peg 10 and is adaptable to receive an alignment pin 36 to couple the peg to a wire harness pegboard. By way of example and without limitation FIGS. 27 and 28 illustrate coupling members that include an alignment pin 36. The aperture 90 of the peg may be aligned with the coupling member, allowing the alignment pin 36 to extend through the aperture 90. The coupling member shown in FIG. 27 includes a base 14 and magnet receiving pocket 32. The pocket 32 is adaptable for receiving magnet 30 (illustrated in FIG. 26) to magnetically couple the coupling member and peg 10 to a wire harness peg board. Alternatively, the coupling member illustrated in FIG. 28 includes an extension of base 14 and alignment pins 28 extending from a bottom of the base 14. The alignment pins 28 may be utilized to couple the pegs 10 to a wire harness peg board in a desired location on the board. As a further alternative, a support bracket 38 having an alignment pin 28 may be utilized to couple the mushroom pegs 10 onto the wire harness pegboard in a varied orientation. FIG. 25 also illustrates a base 14 having a magnet receiving pocket 32. The base of FIG. 25 may be modified to create an extension to the base 14 of the peg 10 and to magnetically couple to a wire harness pegboard.

Figure 23:
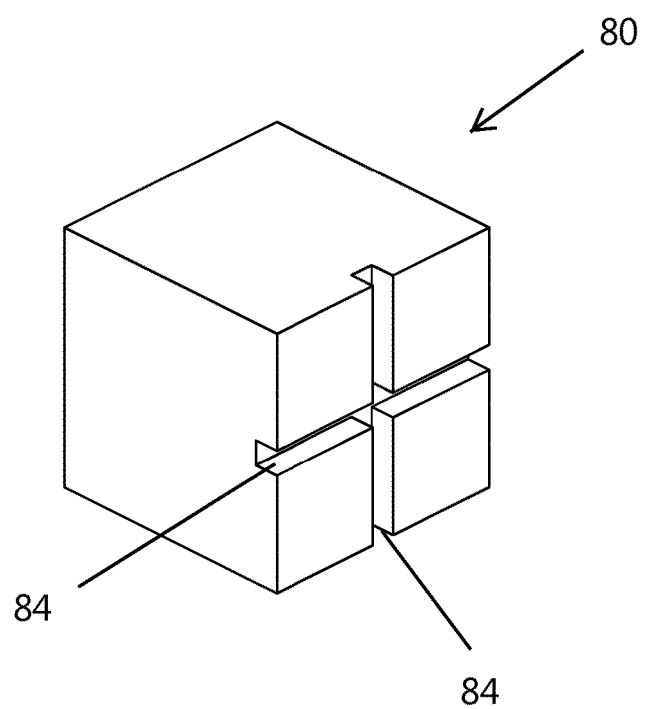
FIG. 23 is a perspective view of an embodiment of a channel diverter of the present invention.
Figure 24:
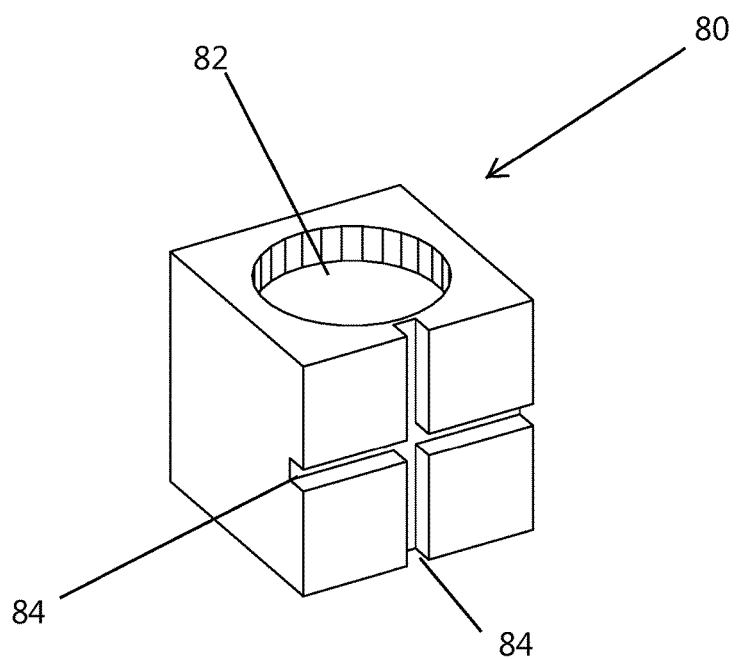
FIG. 24 is a perspective view of an embodiment of a channel diverter of the present invention.
Figure 29:
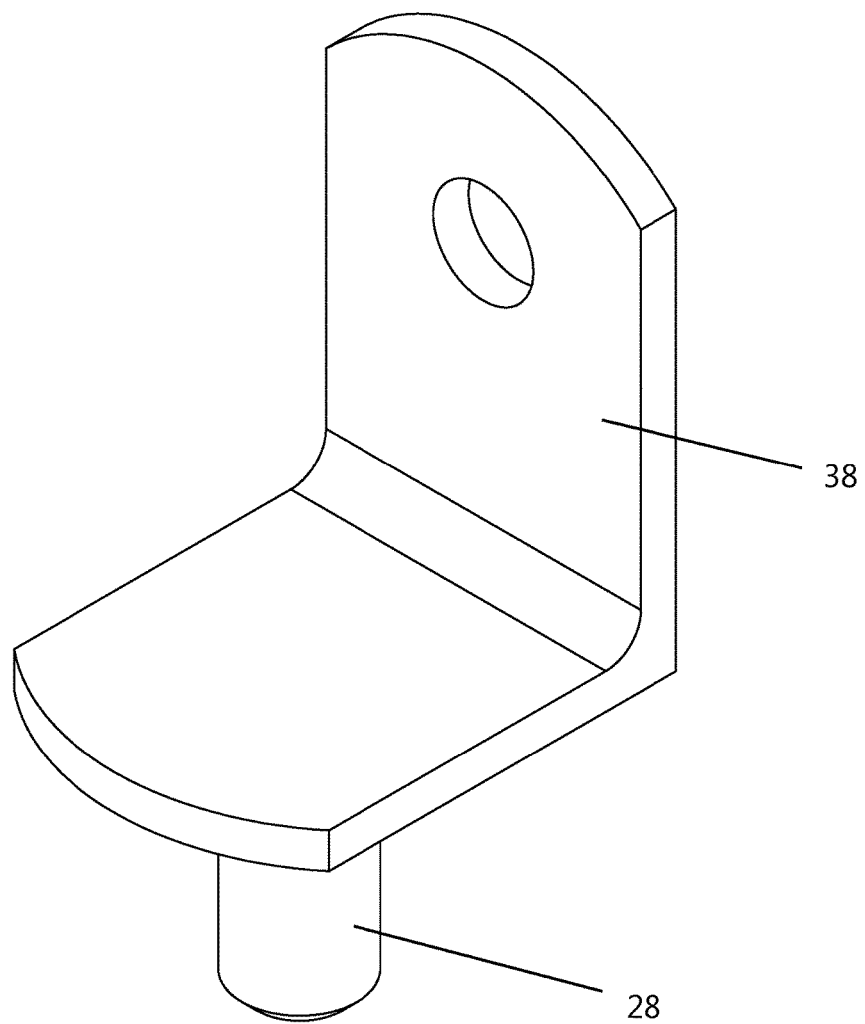
FIG. 29 is a perspective view of an embodiment of a wire retaining peg bracket of the present invention.

FIGS. 28 and 29 illustrate a peg 10 embodiment according to aspects of the invention having wire channel diverters 80 coupled to portions of the peg 10. The wire channel diverter 80 may be positioned on the peg in a desired location to further direct a wire in a preferred orientation. Those skilled in the art will appreciate that numerous configurations may be created by adding or removing one or more diverters 80. FIGS. 23 and 24 further illustrate alternate embodiments of the diverter 80. The diverter 80 includes slots and one or more magnetic pockets 82. The slots may be utilized to contain rubber sheet material (for example, glued into the slots) as another modular option to manage the wire on the pegboard. The magnet receiving pockets 82 are adapted to receive magnets. Further, the diverter and peg 10 may be constructed of a ferromagnetic material to allow the diverter to magnetically couple to the peg 10.

These and various other aspects and features of the invention are described with the intent to be illustrative, and not restrictive. This invention has been described herein with detail in order to comply with the patent statutes and to provide those skilled in the art with information needed to apply the novel principles and to construct and use such specialized components as are required. It is to be understood, however, that the invention can be carried out by specifically different constructions, and that various modifications, both as to the construction and operating procedures, can be accomplished without departing from the scope of the invention. Further, in the appended claims, the transitional terms comprising and including are used in the open ended sense in that elements in addition to those enumerated may also be present. Other examples will be apparent to those of skill in the art upon reviewing this document.

What is claimed is:

1. A wire retaining device for a wire harness assembly peg board, said device comprising:
    a base having a bottom portion suitable for coupling to a wire harness peg board;
    a main body extending upward from a top portion of said base, said main body having a channel extending through the main body, wherein a first inner sidewall and second inner sidewall of the main body define a portion of the channel and wherein said first inner sidewall opposes said second inner sidewall;
    a first wire retaining members joined to said first inner sidewall and a second wire retaining member joined to the second inner sidewall of the main body, said first and second wire retaining members positioned within said channel of said main body; and
    a first coupling having a first joint portion formed within the first inner sidewall of the main body and a second joint portion formed onto the first wire retaining member, wherein the first joint portion and second joint portion of the first coupling join together the main body and the first wire retaining member; and
    a second coupling having a first joint portion formed within the second inner sidewall of the main body and a second joint portion formed onto the second wire retaining member, wherein the first joint portion and second joint portion of the second coupling join together the main body and the second wire retaining member; and
    wherein the first and second wire retaining members project outward from corresponding first and second inner sidewalls at acute angles from corresponding first and second sidewalls of the main body.

2. The wire retaining device as recited in claim 1, wherein the first and second members project outwards at opposing acute angles.

3. The wire retaining device as recited in claim 2, wherein said wire retaining members restrict movement of a wire through the main body in only one lateral direction.

4. The wire retaining device as recited in claim 2, wherein said first joint portion and second joint portion of each of the first and second couplings are of a modified tongue and groove type.

5. The wire retaining device as recited in claim 1, wherein said wire retaining members are constructed of a pliable material.

6. The wire retaining device as recited in claim 1, wherein said wire retaining members include a triangular cross section.

7. The wire retaining device as recited in claim 1, wherein said main body includes outer sidewalls that form an arc extending between opposing ends of the main body.

8. A wire retaining device for a wire harness assembly peg board, said device comprising:
    a base having a bottom portion suitable for coupling to a wire harness peg board;
    a main body extending from atop portion of said base, said main body having a channel extending through the main body, wherein a first inner sidewall and second inner sidewall of the main body define a portion of the channel and wherein said first inner sidewall opposes said second inner sidewall;
    wire retaining members that are joined to said first inner sidewall and second inner sidewall of the main body, said wire retaining members positioned within said channel of said main body, wherein said wire retaining members project outward at acute angles from corresponding first and second sidewalls of said main body; and a coupling having a first joint portion formed within said main body and a second joint portion formed onto the wire retaining members, wherein the first joint portion and second joint portion join together the main body and the wire retaining members.

9. The wire retaining device as recited in claim 8, wherein said wire retaining members restrict movement of a wire through the main body in only one lateral direction.

10. The wire retaining device as recited in claim 8, wherein said first joint portion and second joint portion are of a modified tongue and groove type.

11. The wire retaining device as recited in claim 8, wherein said wire retaining members are constructed of a pliable material.

12. The wire retaining device as recited in claim 8, wherein said wire retaining members include a triangular cross section.

13. The wire retaining device as recited in claim 8, wherein said main body includes outer sidewalls that form an arc extending between opposing ends of the main body.

14. A wire retaining device for a wire harness assembly peg board, said device comprising:
- a base having a bottom portion suitable for coupling to a wire harness peg board;
- a main body having first and second opposing columns extending from a top portion of said base, said opposing columns defining a wire receiving channel between the two opposing columns;
- first and second wire retaining members that are joined to corresponding first and second columns, said wire retaining members positioned within said wire receiving channel, wherein said wire retaining members project outward from corresponding first and second columns of said main body at acute angles, and further wherein said wire retaining members restrict movement of a wire through the wire receiving channel in a first lateral direction and allows movement in a second lateral direction that is opposite the first lateral direction; and
- a coupling having corresponding first joint portions formed within said first and second columns and second corresponding joint portions formed on ends of the wire retaining members, wherein the first joint portions and second joint portions join together the columns and the wire retaining members.

15. The wire retaining device as recited in claim 14, wherein said first joint portions and second joint portions are of a modified tongue and groove type.

16. The wire retaining device as recited in claim 14, wherein said wire retaining members are constructed of a pliable material.

17. The wire retaining device as recited in claim 14, wherein said wire retaining members include a triangular cross section.

18. The wire retaining device as recited in claim 14, wherein said first and second opposing columns each includes an outer sidewall that forms an arc extending between opposing ends of the column.

\* \* \* \* \*